(12) United States Patent
Kang et al.

(10) Patent No.: US 7,876,613 B2
(45) Date of Patent: Jan. 25, 2011

(54) MULTI-BIT FLASH MEMORY DEVICES HAVING A SINGLE LATCH STRUCTURE AND RELATED PROGRAMMING METHODS, SYSTEMS AND MEMORY CARDS

(75) Inventors: Sang-Chul Kang, Gyeonggi-do (KR); Ho-kil Lee, Gyeonggi-do (KR); Jin-Yub Lee, Seoul (KR)

(73) Assignee: Samsung Electronics Co., Ltd. (KR)

( * ) Notice: Subject to any disclaimer, the term of this patent is extended or adjusted under 35 U.S.C. 154(b) by 134 days.

(21) Appl. No.: 12/182,274

(22) Filed: Jul. 30, 2008

(65) Prior Publication Data

US 2008/0310226 A1    Dec. 18, 2008

Related U.S. Application Data

(63) Continuation-in-part of application No. 11/801,792, filed on May 11, 2007, now Pat. No. 7,643,339.

(30) Foreign Application Priority Data

May 18, 2006   (KR) ...................... 10-2006-0044833
Jul. 30, 2007   (KR) ...................... 10-2007-0076401

(51) Int. Cl.
  *G11C 11/34*   (2006.01)
  *G11C 16/04*   (2006.01)
  *G11C 16/06*   (2006.01)
(52) U.S. Cl. .................. 365/185.03; 365/185.08; 365/185.12; 365/185.22; 365/185.28
(58) Field of Classification Search ............ 365/185.03, 365/185.08, 185.12
  See application file for complete search history.

(56) References Cited

U.S. PATENT DOCUMENTS

| | | | |
|---|---|---|---|
| 5,438,549 A | * | 8/1995 | Levy ........................... 365/229 |
| 5,473,563 A | | 12/1995 | Suh et al. |
| 5,696,717 A | | 12/1997 | Koh |
| 5,751,634 A | | 5/1998 | Itoh |
| 5,768,188 A | | 6/1998 | Park et al. |

(Continued)

FOREIGN PATENT DOCUMENTS

| | | |
|---|---|---|
| DE | 10 2004 033 443 A1 | 2/2005 |
| EP | 1280161 A1 | 1/2003 |
| EP | 1326257 A2 | 7/2003 |
| EP | 1326257 A3 | 8/2006 |
| JP | 11-144479 A | 5/1999 |

(Continued)

OTHER PUBLICATIONS

Notice to File a Response for Korean Application No. 10-2006-0044833; Date of Mailing Nov. 4, 2006.

(Continued)

*Primary Examiner*—Ly D Pham
(74) *Attorney, Agent, or Firm*—Myers Bigel Sibley & Sajovec

(57) ABSTRACT

Multi-bit flash memory devices are provided. The multi-bit flash memory device includes an array of memory cells and a page buffer block including page buffers. Each of the page buffers has a single latch structure and performs a write operation with respect to memory cells according to loaded data. A buffer random access memory (RAM) is configured to store program data provided from an external host device during a multi-bit program operation. Control logic is provided that is configured to control the page buffer block and the buffer RAM so that program data stored in the buffer RAM is reloaded into the page buffer block whenever data programmed before the multi-bit program operation is compared with data to be currently programmed. The control logic is configured to store data to be programmed next in the buffer RAM before the multi-bit program operation is completed.

24 Claims, 23 Drawing Sheets

U.S. PATENT DOCUMENTS

| | | | |
|---|---|---|---|
| 5,862,074 | A | 1/1999 | Park |
| 5,867,429 | A | 2/1999 | Chen et al. |
| 5,923,587 | A | 7/1999 | Choi |
| 5,930,172 | A | 7/1999 | Kucera |
| 5,966,326 | A | 10/1999 | Park et al. |
| 5,982,663 | A | 11/1999 | Park |
| 6,075,734 | A | 6/2000 | Jang |
| 6,122,188 | A | 9/2000 | Kim et al. |
| 6,266,273 | B1 | 7/2001 | Conley et al. |
| 6,278,636 | B1 | 8/2001 | Lee |
| 6,288,935 | B1 | 9/2001 | Shibata et al. |
| 6,496,412 | B1 | 12/2002 | Shibata et al. |
| 6,522,580 | B2 | 2/2003 | Chen et al. |
| 6,813,184 | B2 | 11/2004 | Lee |
| 6,965,964 | B2 | 11/2005 | Lee et al. |
| 7,023,737 | B1 | 4/2006 | Wan et al. |
| 7,035,144 | B2 | 4/2006 | Kim et al. |
| 7,206,233 | B2 | 4/2007 | Shiota et al. |
| 7,257,026 | B2 | 8/2007 | Yamada et al. |
| 7,457,157 | B2 | 11/2008 | Kim |
| 7,499,322 | B2 * | 3/2009 | Lee et al. ............... 365/185.08 |
| 7,571,276 | B2 * | 8/2009 | Cho et al. .................... 711/103 |
| 2001/0053090 | A1 * | 12/2001 | Takata et al. ........... 365/185.08 |
| 2003/0016559 | A1 | 1/2003 | Kawai et al. |
| 2004/0141374 | A1 * | 7/2004 | Park et al. .............. 365/185.08 |
| 2004/0221092 | A1 | 11/2004 | Lee |
| 2005/0162929 | A1 | 7/2005 | Shiota et al. |
| 2005/0276107 | A1 | 12/2005 | Shiga et al. |
| 2006/0164885 | A1 | 7/2006 | Yang et al. |
| 2006/0181924 | A1 | 8/2006 | Cha |
| 2006/0221685 | A1 | 10/2006 | Yamada et al. |
| 2007/0124558 | A1 | 5/2007 | Lee et al. |
| 2007/0268748 | A1 * | 11/2007 | Lee et al. ............... 365/185.08 |

FOREIGN PATENT DOCUMENTS

| | | |
|---|---|---|
| JP | 2001-093288 | 4/2001 |
| JP | 2003-233529 A | 8/2003 |
| JP | 1020030047171 | 1/2005 |
| JP | 2005-032431 | 2/2005 |
| KR | 10-1999-0057216 A | 7/1999 |
| KR | 1020010068554 A | 7/2001 |
| KR | 1020010070086 A | 7/2001 |
| KR | 1020020057055 A | 7/2002 |
| KR | 1020030002730 A | 1/2003 |
| KR | 1020040098642 A | 11/2004 |
| KR | 1020050007653 A | 1/2005 |
| KR | 10-2005-0059249 A | 6/2005 |
| KR | 1020050068554 A | 7/2005 |
| KR | 1020050069218 A | 7/2005 |
| KR | 1020050087264 A | 8/2005 |
| KR | 1020060024149 A | 3/2006 |
| KR | 1020060056236 A | 5/2006 |
| WO | WO 97/50090 | 12/1997 |
| WO | WO98/01861 A1 | 1/1998 |

OTHER PUBLICATIONS

English Translation of Notice to File a Response for Korean Application No. 10-2006-0044833; Date of Mailing Nov. 4, 2006.

European Search Report, Reference: P47895 EP; Application No./Patent No. 07016055.1-1233/1892721.

European Search Report, Application No. 07016257.3, Sep. 23, 2008.

Office Action, DE Application No. 10 2007 023 533.1-56, Nov. 2, 2010, 2 pages.

* cited by examiner

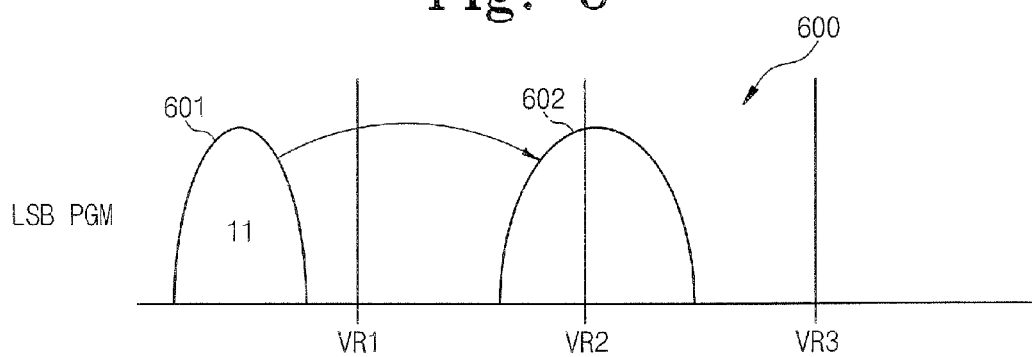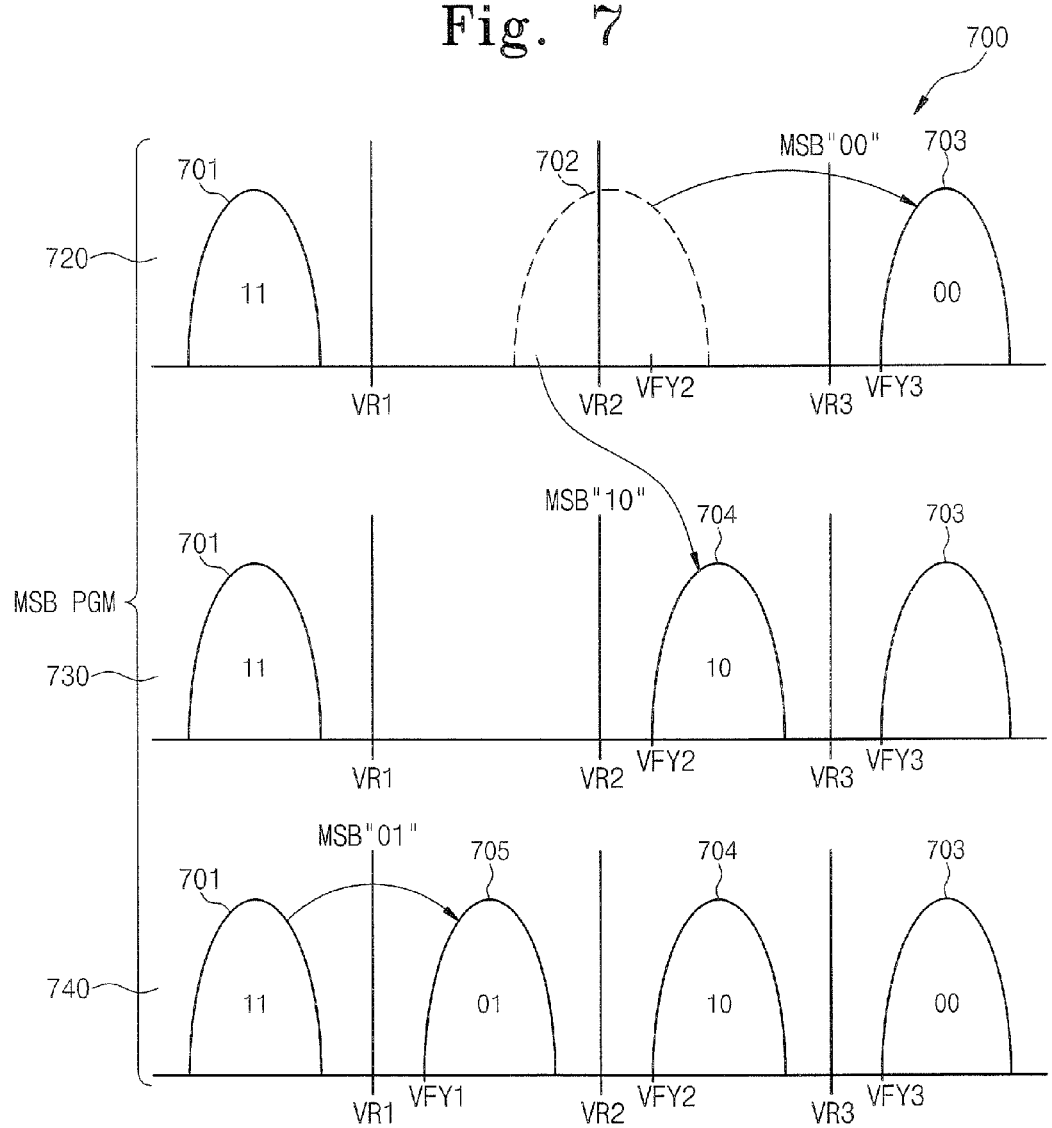

Fig. 8
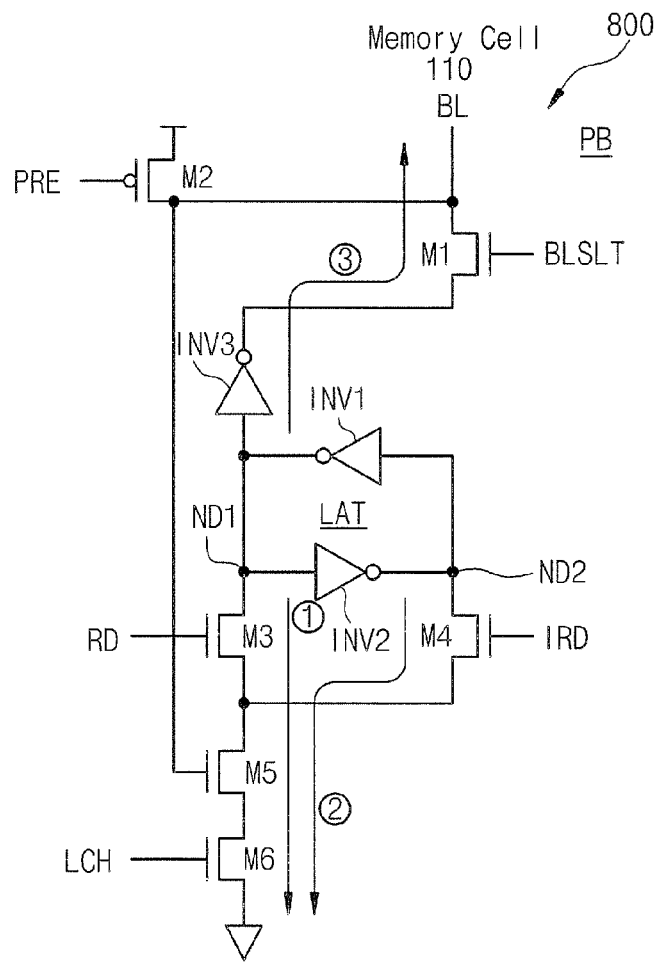
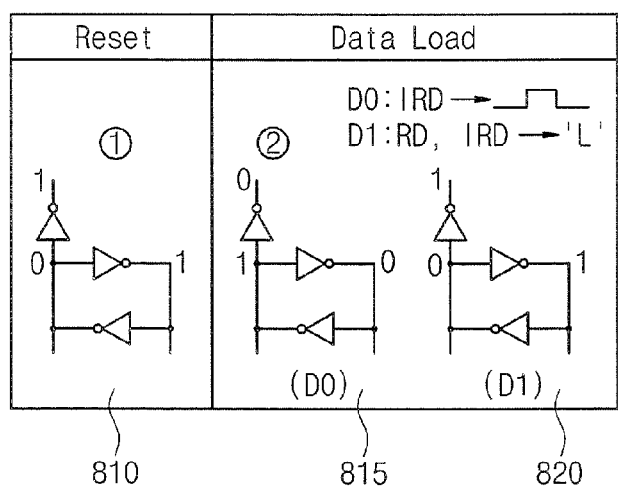

Fig. 9
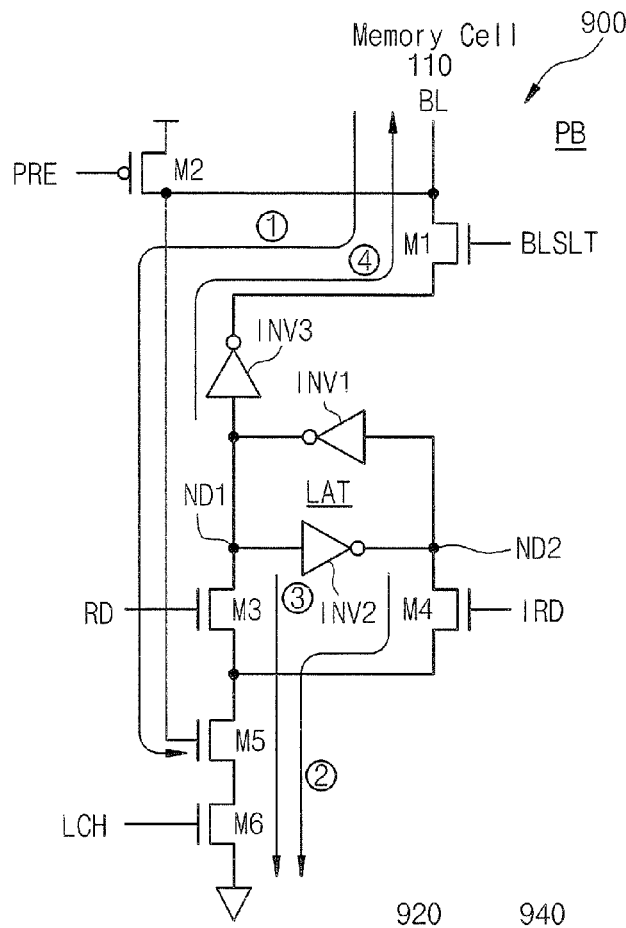
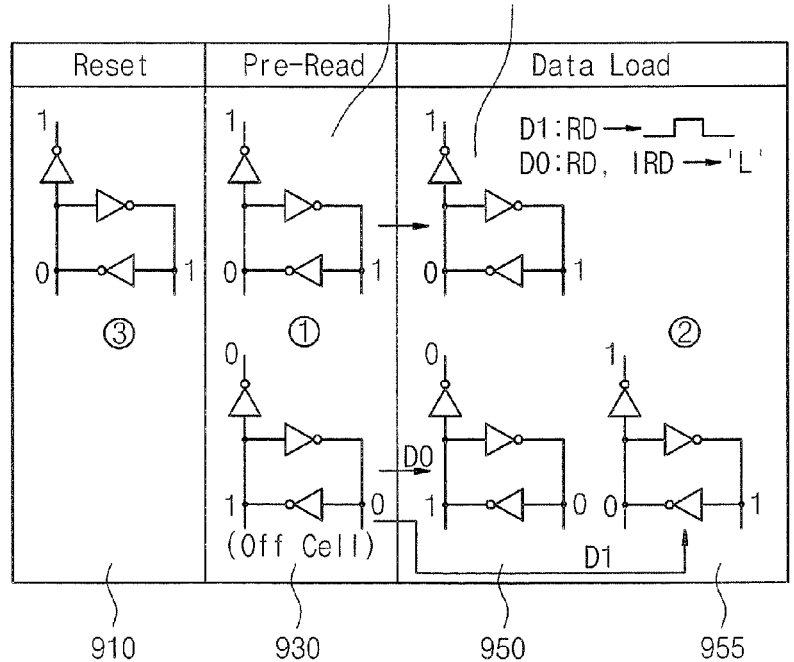

Fig. 10
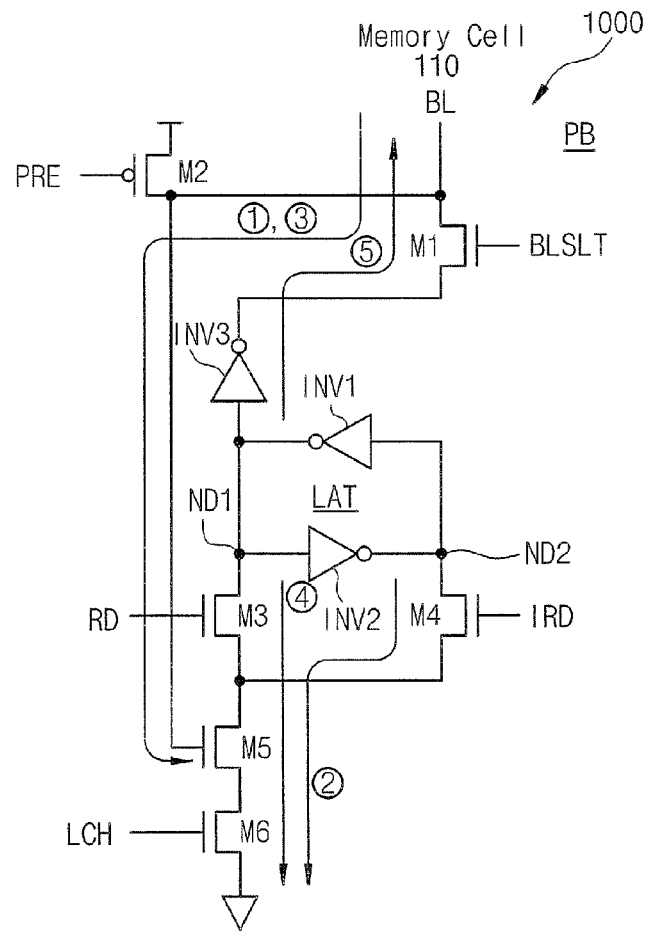
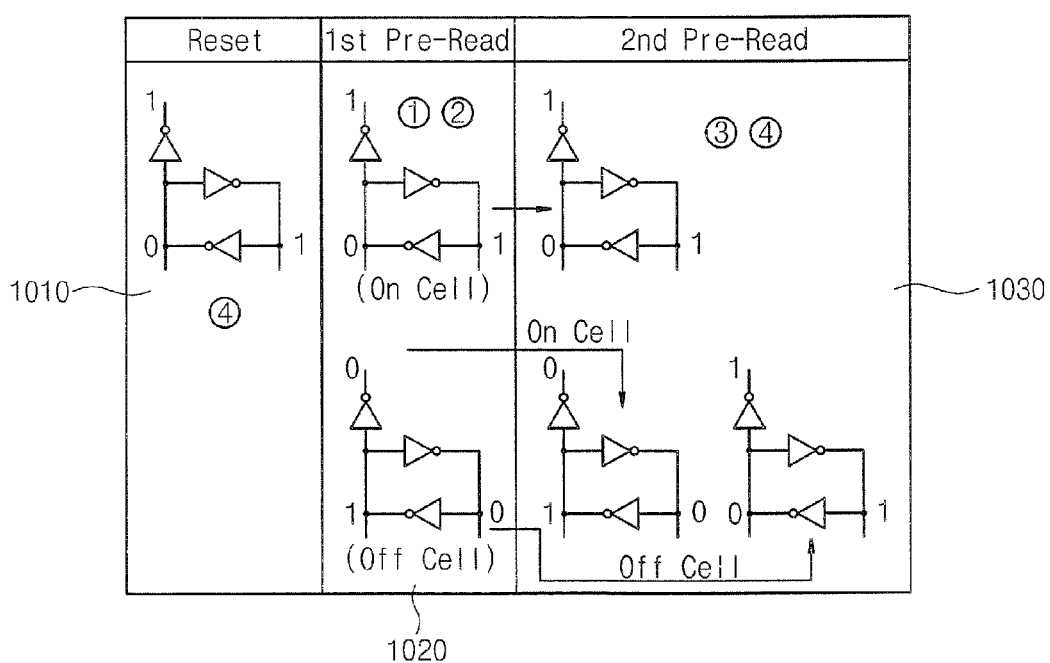

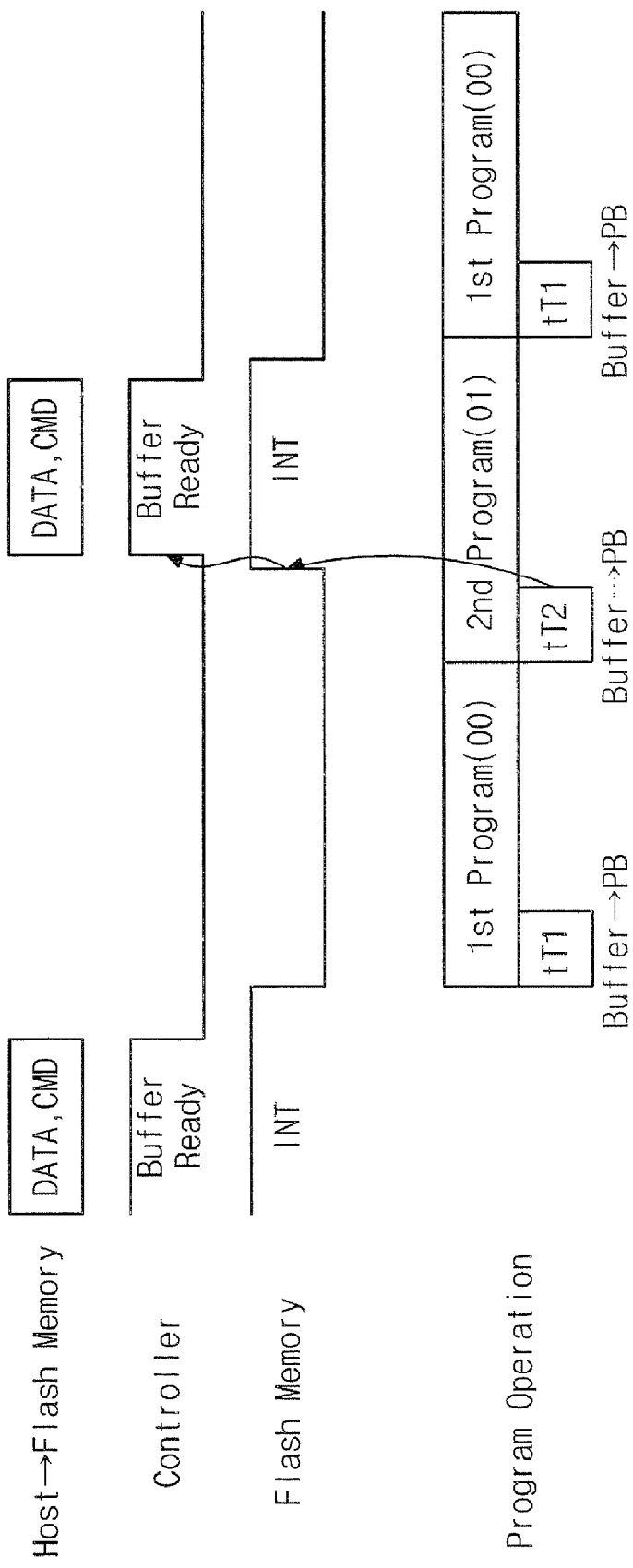

MULTI-BIT FLASH MEMORY DEVICES HAVING A SINGLE LATCH STRUCTURE AND RELATED PROGRAMMING METHODS, SYSTEMS AND MEMORY CARDS

CROSS-REFERENCE TO RELATED APPLICATION

This application is a continuation-in-part of U.S. patent application Ser. No. 11/801,792, filed May 11, 2007, now U.S. Pat. No. 7,643,339, issue date Jan. 5, 2010 which claims priority to Korean Patent Application No. 2006-0044833, filed May 18, 2006, and to Korean Patent Application No. 2007-0076401, filed Jul. 30, 2007, the disclosures of which are hereby incorporated herein by reference as if set forth in their entirety.

FIELD OF THE INVENTION

The present invention generally relates to non-volatile memory devices and, more particularly, to multi-bit non-volatile memory devices and related methods, systems and memory cards.

BACKGROUND OF THE INVENTION

The demand for non-volatile semiconductor memory devices has significantly increased because data stored in the non-volatile memory device may not be erased when power is removed from the device. Flash memory devices may be used as non-volatile memory devices. In these devices, memory cells may be provided by a single transistor. Thus, memory devices including flash memory may be relatively smaller than other memory devices. Therefore, flash memory may be used instead of, for example, magnetic disks, for storing large amounts of data. Details with respect to conventional non-volatile semiconductor memory devices are discussed in U.S. Pat. No. 5,751,634 (the '634 patent) entitled NON-VOLATILE SEMICONDUCTOR MEMORY DEVICE FOR STORING MULTIVALUE DATA AND READOUT/WRITE-IN METHOD THEREFOR to Itoh, the disclosure of which is incorporated herein by reference as if set forth in its entirety.

In particular, the '634 patent discusses a flash memory device including memory cells for storing 2-bit data connected to a bit line. As discussed therein, first and second flip-flop circuits are coupled to the bit line. The first flip-flop circuit stores the lower bit (least significant bit (LSB)) of 2-bit data read out from or written into the memory cell. Similarly, the second flip-flop circuit stores the upper bit (most significant bit (MSB)) of 2-bit data read out from or written into the memory cell. Thus, during a data read operation, the MSB bit is read out of the memory cell first and then the LSB is read out from the memory cell. Similarly, during a data write operation, the MSB bit is written first into the memory cell and then the LSB is written into the memory cell.

Thus, the non-volatile semiconductor memory devices discussed in the '634 patent may provide a memory device having a large capacity, but capable of being manufactured at a low cost without using a difficult patterning technique or developing a new manufacturing technique. However, improved memory devices may still be desired.

SUMMARY OF EMBODIMENTS OF THE PRESENT INVENTION

Some embodiments of the present invention provide multi-bit flash memory devices. The multi-bit flash memory device includes an array of memory cells and a page buffer block including page buffers. Each of the page buffers has a single latch structure and performs a write operation with respect to memory cells according to loaded data. A buffer random access memory (RAM) is configured to store program data provided from an external host device during a multi-bit program operation. Control logic is provided that is configured to control the page buffer block and the buffer RAM so that program data stored in the buffer RAM is reloaded into the page buffer block whenever data programmed before the multi-bit program operation is compared with data to be currently programmed. The control logic is configured to store data to be programmed next in the buffer RAM before the multi-bit program operation is completed.

In further embodiments of the present invention, the multi-bit program operation may include an LSB program operation and an MSB program operation, the MSB program operation including a plurality of program operations. The control logic may be further configured to output a buffer accessible signal to the external host device after program data in the buffer RAM is reloaded into the page buffer block within the last one of the plurality of program operations. In certain embodiments, the buffer RAM may be configured to store data to be next programmed under the control of the control logic when the buffer accessible signal is transferred to the external host device.

In still further embodiments, the control logic may be further configured to receive a write command from the external host device when the buffer accessible signal is output to the external host device, and perform a next multi-bit program operation in response to the received write command.

In some embodiments of the present invention, each of the memory cells is programmed to have one of "01", "10" and "00" states, the plurality of program operations is formed of first to third program operations, and the third program operation is the last program operation. The memory cells may be programmed to have one of the "01", "10", and "00" states via the first to third program operations.

In further embodiments of the present invention, each of the memory cells may be programmed to have one of "00", "10" and "01" states, the plurality of program operations is formed of first and second program operations, and the second program operation is the last program operation. The memory cells may be programmed to have one of the "00" and "01" states via the first and second program operations.

Although embodiments of the present invention are discussed above primarily with respect to memory devices, systems, memory cards and methods are also provided herein.

BRIEF DESCRIPTION OF THE DRAWINGS

FIG. 6 is a diagram illustrating an LSB program according to some embodiments of the present invention.

FIG. 7 is a diagram illustrating MSB programs according to some embodiments of the present invention.

FIG. 8 is a schematic diagram illustrating operations of a page buffer during an LSB program according to some embodiments of the present invention.

FIG. 9 is a schematic diagram illustrating operations of a page buffer during an MSB "00" program according to some embodiments of the present invention.

FIG. 10 is a schematic diagram illustrating operations of a page buffer during an MSB "10" program according to some embodiments of the present invention.

FIGS. 24 and 25 are timing diagrams of memory cards illustrating operations of programming methods according to some embodiments of the present invention.

DETAILED DESCRIPTION OF EMBODIMENTS OF THE INVENTION

Figure 1:
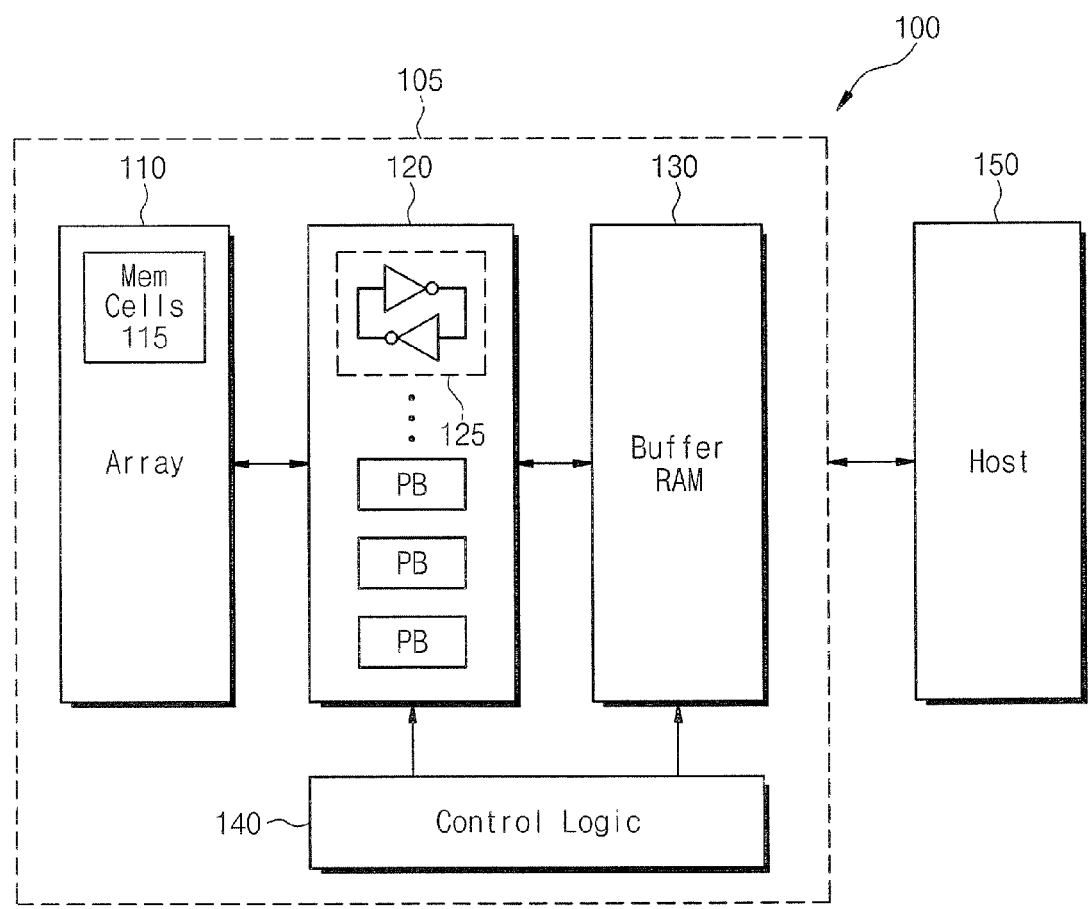
FIG. 1 is a block diagram of a multi-bit flash memory system according to some embodiments of the present invention.

The invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the sizes or configurations of elements may be idealized or exaggerated for clarity.

It will be understood that when an element is referred to as being "connected to" or "coupled to" another element, it may be directly connected or coupled to the other element or intervening elements may be present. In contrast, when an element is referred to as being "directly connected to" or "directly coupled to" another element, there are no intervening elements present. Like numbers refer to like elements throughout. As used herein, the term "and/or" includes any and all combinations of one or more of the associated listed items.

It will be understood that, although the terms first, second, third etc. may be used herein to describe various elements, components and/or sections, these elements, components and/or sections should not be limited by these terms. These terms are only used to distinguish one element, component, or section from another element, component or section. Thus, a first element, component or section discussed below could be termed a second element, component or section without departing from the scope of the present invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and this specification, and will not be interpreted in an idealized or overly formal sense unless expressly so defined herein.

As will be discussed below with respect to FIGS. 1 through 25, some embodiments of the present invention provide improved non-volatile memory devices and related systems, methods and memory cards. In particular, some embodiments of the present invention provide multi-bit non-volatile memory devices including a page buffer having a single latch structure, i.e., the page buffer includes a plurality of single latches. The single latch structure is configured to store a first bit of multi-bit data, for example, a least significant bit (LSB) of multi-bit data and to store intermediate data during the programming process. Memory devices according to some embodiments of the present invention also include a buffer random access memory (RAM). A second bit of multi-bit data, for example, a most significant bit (MSB) of the multi-bit data is stored in the buffer RAM. The combination of the single latch page buffer and the buffer RAM according to some embodiments of the present invention may enable smaller devices to be manufactured as the combination structure occupies less space in the memory device than the conventional double latch structure. Furthermore, memory devices according to some embodiments of the present invention may also provide improved performance as will be discussed below with respect to FIGS. 1 through 25.

Referring first to FIG. 1, a multi-bit flash memory system 100 according to some embodiments of the present invention will be discussed. As illustrated in FIG. 1, the system 100 includes a multi-bit flash memory device 105 coupled to an external host device 150. In some embodiments of the present invention, the interface between the flash memory device 105 and the external host device 150 may be a NOR interface. It will be understood that the flash memory device 105 can be any flash memory device capable of operating as discussed herein. For example, in some embodiments of the present invention, the flash memory device could be a NAND or a NOR flash memory device without departing from the scope of the present invention.

As further illustrated in FIG. 1, the flash memory device 105 includes a memory cell array 110, a page buffer 120, a buffer RAM 130 and control logic 140. The memory cell array 110 may include one or more memory cells 115. In some embodiments of the present invention, the memory cell array 110 may include a string cell of NAND flash memory. In some embodiments of the present invention, the flash memory device 105 may be a OneNAND flash memory device. The OneNAND flash memory device includes a NAND cell array and a NOR interface between the flash memory device 105 and the host 150.

The page buffer 120 is electrically coupled to the memory cell array 110 and the buffer RAM 130 as illustrated in FIG. 1. The page buffer 120 includes one or more single latches 125, which are configured to store a first bit of multi-bit data to be written into or read out from one of the memory cells 115 of the memory cell array 110. In some embodiments of the present invention, the first bit of multi-bit data may be the least significant bit (LSB) of multi-bit data. The page buffer 120 is also configured to store intermediate program data during the programming operation (write operation) as will be further discussed below. Thus, the page buffer 120 according to some embodiments of the present invention may operate as a driver during a write (program) operation and as a sense amplifier during a read operation.

As further illustrated in FIG. 1, the buffer RAM 130 is electrically coupled to the page buffer 120. The buffer RAM 130 is configured to store a second bit of the multi-bit data to be written into or read out from one of the memory cells 115 of the memory cell array 110. In some embodiments of the present invention, the second bit of multi-bit data is the most significant bit (MSB) of multi-bit data. In some embodiments of the present invention, the program data may include MSB intermediate program (write) data as will be discussed further below. In some embodiments of the present invention, the buffer RAM 130 may include static RAM (SRAM) or dynamic RAM (DRAM).

As discussed above, the buffer RAM occupies significantly less space than the latches of the page buffer. Therefore, by only including a page buffer 120 having single latches, rather than the conventional double latch, some embodiments of the present invention may provide a more compact and integrated memory device. Thus, memory devices according to some embodiments of the present invention may be suitable for use in small portable devices, such as mobile terminals and the like.

The control logic 140 contains the control signals configured to begin and end a programming (write) operation and/or a read operation. For example, the buffer RAM 130 may be configured to temporarily store data from the memory cell array 110 through the page buffer 120 in response to a control signal generated by the control logic 140. Operations of control logic blocks are known to those having skill in the art and will not be discussed in further detail herein in the interest of brevity.

The control logic 140 may be configured to control an interrupt signal in order to receive data to be next written and a write command from the external host device 150 before an operation of programming MSB data. For example, the control logic 140 may set the interrupt signal to a ready state from a busy state while an operation of programming MSB data is carried out. The external host device 150 may provide data to be written and a write command to the multi-bit flash memory device 105 in response to the interrupt signal of a ready state. This may mean that during an MSB data programming process, data to be next written is loaded onto the buffer RAM 130 from the external host device 150.

Figure 19:
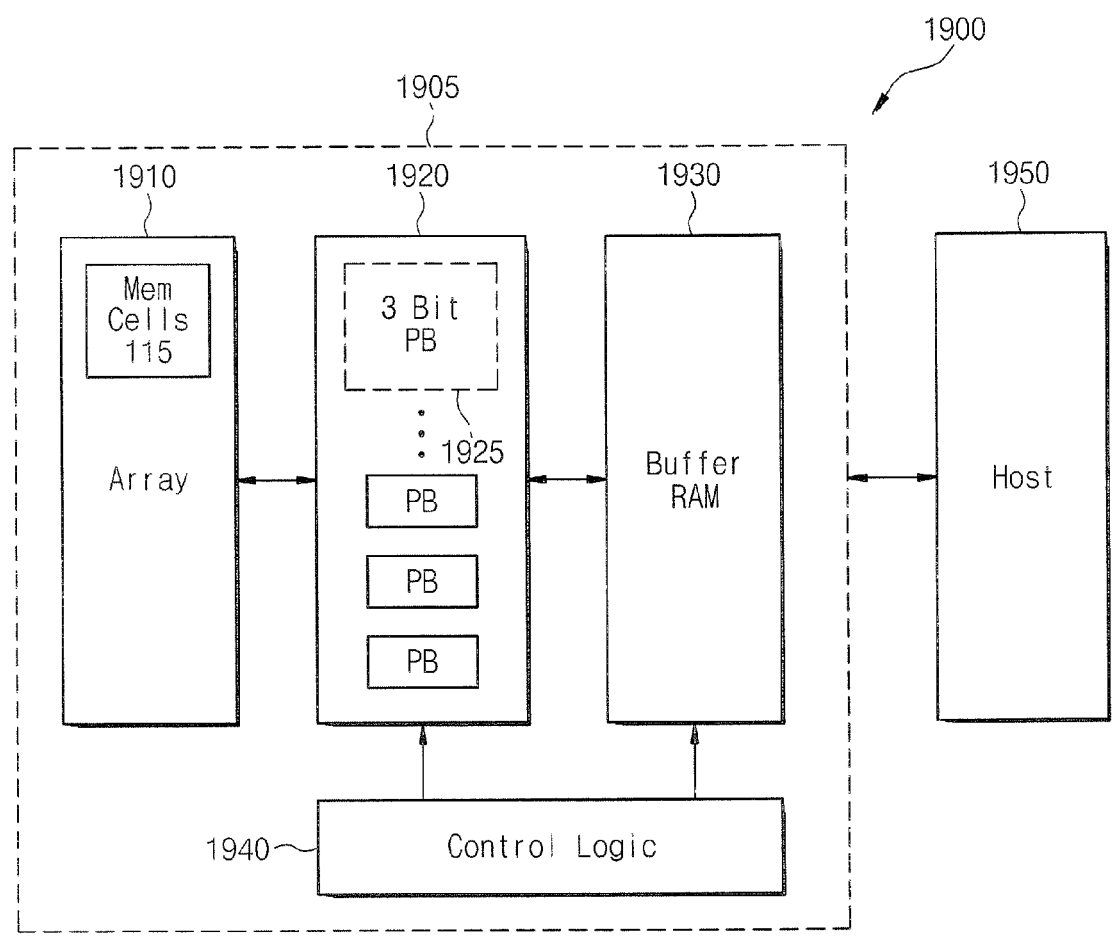
FIG. 19 is a block diagram of a multi-bit flash memory system according to some embodiments of the present invention.

Although embodiments of the present invention are discussed above with respect to a two bit multi-bit data having an MSB and an LSB and a page buffer configured to store a first bit of multi-bit data (LSB), embodiments of the present invention are not limited to this configuration. The page buffer may be configured to store more than a single bit of multi-bit data. For example, as illustrated in FIG. 19, some embodiments of the present invention may include four bit multi-bit data, where the page buffer 1920 is configured to store the three least significant bits of the four bit multi-bit data and the MSB of the four bit multi-bit data may be stored in the buffer RAM 1930.

Figure 2:
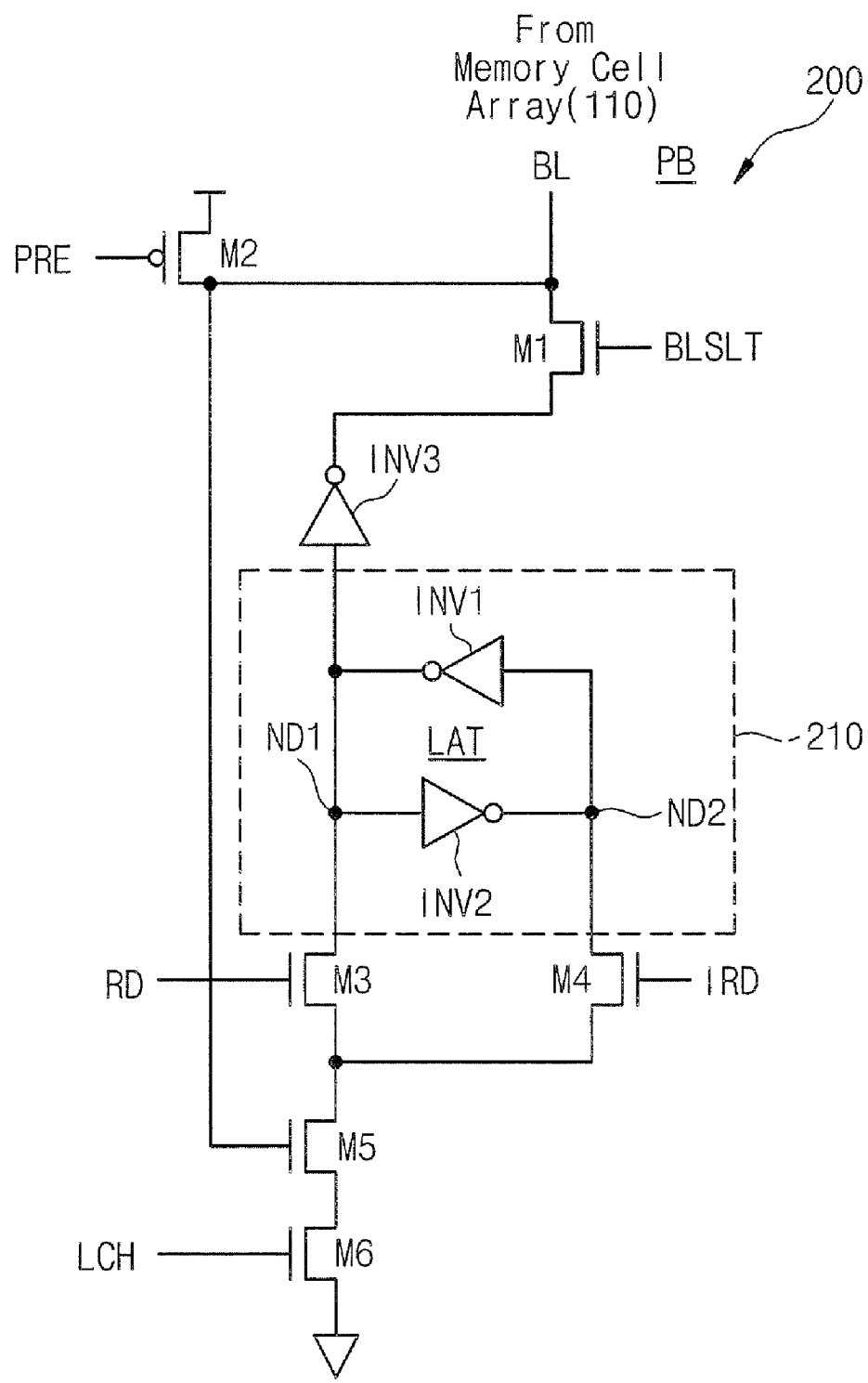
FIG. 2 is a schematic diagram of a page buffer according to some embodiments of the present invention.

Referring now to FIG. 2, a schematic block diagram of a page buffer according to some embodiments of the present invention will be discussed. As illustrated in FIG. 2, a page buffer 200 includes a PMOS transistor M2, first through fifth NMOS transistors M1 and M3 through M6 and three invertors INV1 through INV3 connected as shown in FIG. 2. The single latch structure 210 according to embodiments of the present invention includes first and second invertors INV1 and INV2 connected as shown. It will be understood that FIG. 2 illustrates a single page buffer cell. Memory devices according to embodiments of the present may include a plurality of these cells as illustrated in the page buffer 120 of FIG. 1. The page buffer operates responsive to a precharge signal PRE, data received from the memory cell array 110 (FIG. 1) on the bit line (BL), a bit line select signal (BLSLT), a read signal RD, an inverse read signal (IRD) and a latch signal (LCH). Circuits such as the page buffer of FIG. 2 are known to those having skill in the art and, therefore, details with respect to the operation thereof will be omitted herein in the interest of brevity.

Figure 3:
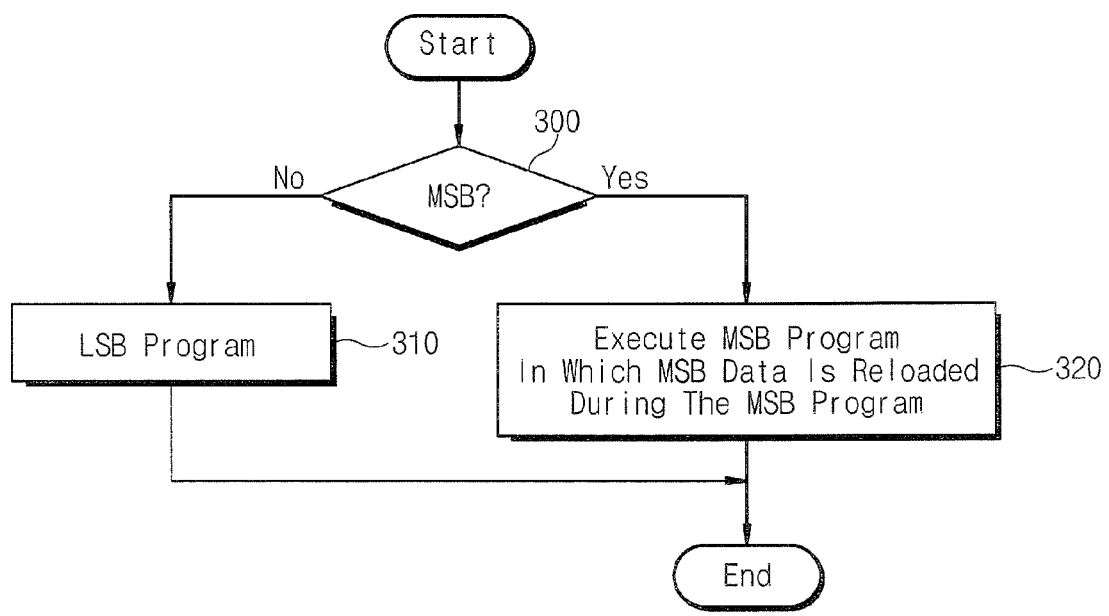
FIG. 3 is a flowchart illustrating operations of programming methods according to according to some embodiments of the present invention.

Referring now to FIGS. 3 through 7, operations according to some embodiments of the present invention will be discussed. Referring now to FIG. 3, a flowchart illustrating operations of programming methods (writing operations) to according to some embodiments of the present invention will be discussed. Methods of programming (writing operations) according to embodiments of the present invention are performed in a multi-bit non-volatile memory device including a memory cell array including a plurality of memory cells, a page buffer coupled to the memory cell array including a plurality of latches and a buffer RAM coupled to the page buffer as discussed above with respect to FIGS. 1 and 2.

As illustrated in FIG. 3, operations begin at block 300 by determining if an MSB is being programmed (written). If it is determined that an MSB is not being programmed (block 300), the LSB program is executed (block 310). If, on the other hand, it is determined that the MSB is being programmed (block 300), the MSB program is executed (block 320). It will be understood that executing of the MSB program (block 320), the data may be reloaded from the buffer RAM 130 (FIG. 1) to the page buffer 120 (FIG. 1).

Figure 4:
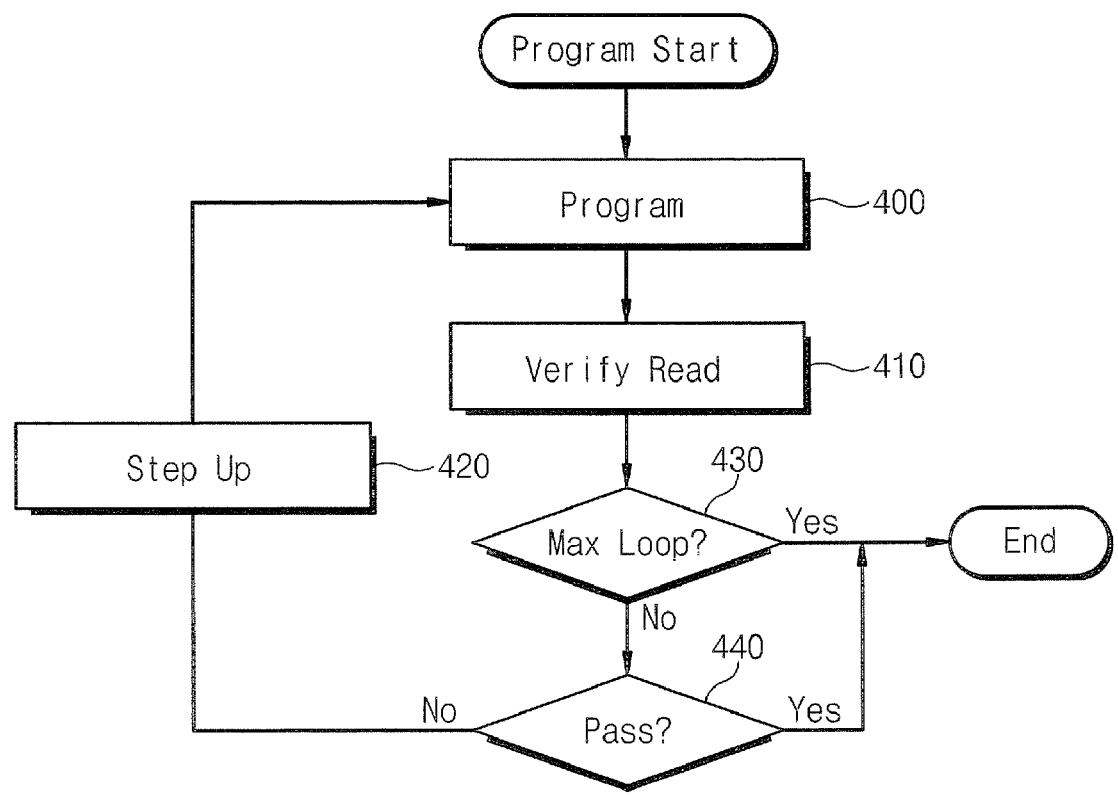
FIG. 4 is a flowchart illustrating operations of a least significant bit (LSB) program according to some embodiments of the present invention.

Operations of the LSB program according to some embodiments of the present invention will now be discussed with respect to FIGS. 4 and 6. As illustrated in FIG. 4, operations begin at block 400 by executing the LSB program. As illustrated in FIG. 6, the cell threshold voltage distribution begins at "11" 601 (the erase state). A verify read is performed using a read word line voltage (VR1) as shown in FIG. 4

(block 410). It is determined if the maximum number of iterations have been reached for the LSB program (block 430). If it is determined that the maximum number of iterations has been reached (block 430), operations of the LSB program terminate. If, on the other hand, it is determined that the maximum number of iterations has not been reached (block 430), it is determined if the cell threshold voltage distribution is "10" (602 of FIG. 6) (block 440). If it is determined that the cell threshold voltage distribution is "10" (block 440), the LSB program has passed and operations of the LSB program are terminated. If, on the other hand, it is determined that the cell threshold distribution is not "10" (block 440), the word line voltage is stepped up and operations of blocks 400 through 440 are repeated until either maximum number of iterations is reached (block 430) or the cell threshold voltage distribution "10" is reached (block 440) (block 420). In some embodiments of the present invention, the step up program (block 420) may be an incremental step pulse program (ISPP), however, embodiments of the present invention are not limited to this configuration.

In other words, as illustrated in the diagram illustrating an LSB program 600 of FIG. 6, the LSB program begins with a cell threshold distribution voltage "11" 601 (the erase state) and ends with a cell threshold distribution of "10" 602. As illustrated by the flowchart of FIG. 4, this transition may not happen in one programming step, it may take several programming iterations before the final state "10" is achieved, i.e., before the pass (block 440) is generated.

Figure 5:
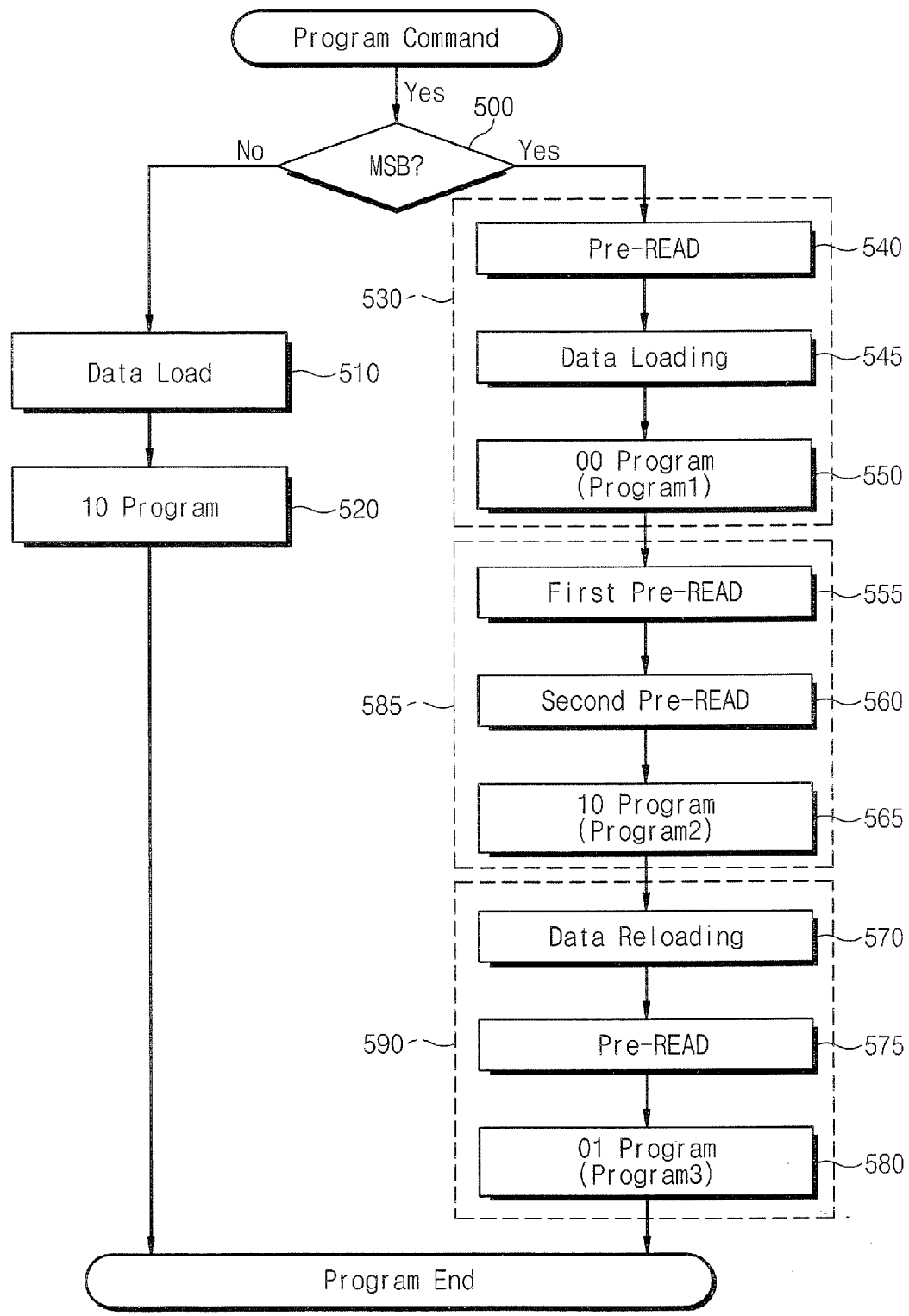
FIG. 5 is a flowchart illustrating operations of most significant bit (MSB) programs according to some embodiments of the present invention.

Operations of the MSB program according to some embodiments of the present invention will now be discussed with respect to FIGS. 5 and 7. Referring first to FIG. 5, a flowchart illustrating operations of most significant bit (MSB) programs according to some embodiments of the present invention will be discussed. As illustrated in FIG. 5, operations begin at block 500 by determining if the MSB is being programmed. If it is determined that the MSB is not being programmed (block 500), operations of blocks 510 and 520 are performed which correspond to the LSB program discussed above with respect to FIG. 4. If, on the other hand, it is determined that the MSB is being programmed (written into the memory cell array), operations proceed to block 540. The flowchart of FIG. 5 is divided into three sections. Blocks 540-550 represent the operations of the MSB "00" program (block 530), blocks 555-565 represent the operations of the MSB "10" program (block 585) and blocks 570-580 represent the operations of the MSB "01" program (block 590) according to some embodiments of the present invention.

Executing the MSB "00" program (block 530) includes pre-reading data (block 540) from the memory cell, loading data into the page buffer (block 545) and executing the "00" program (block 550). This is further illustrated in FIG. 7. As illustrated in FIG. 7, during the MSB "00" program 720 the cell threshold voltage distribution of "10" 702 and transitions to a cell threshold voltage distribution of "00" 703. Thus, cells 702 and 703 correspond to the loaded data "0".

Executing the "10" program (block 585) includes pre-reading a first time (block 555), pre-reading a second time (block 560) and executing a "10" program (block 565). This is further illustrated in FIG. 7. As illustrated in FIG. 7, during the MSB "10" program 730 the cell threshold voltage distribution of "10" 702 and transitions to a cell threshold voltage distribution of "10" 704. This particular program can be referred to as shadow programming and is discussed U.S. Pat. No. 5,751,634 (the '634 patent) entitled NON-VOLATILE SEMICONDUCTOR MEMORY DEVICE FOR STORING MULTIVALUE DATA AND READOUT/WRITE-IN METHOD THEREFOR to Itoh, the disclosure of which has been incorporated herein by reference as if set forth in its entirety. As further illustrated in FIG. 7, VR1 is less than Vth of the selected cells, which is less than VFY2.

The results of the MSB "00" and "10" programs produce intermediate program data. This intermediate data may be stored in the page buffer 120 (FIG. 1) as discussed above with respect to FIG. 1.

Executing the MSB "01" program (block 590) comprises reloading data, through the page buffer (block 570), a result of the MSB "10" program, pre-reading data (block 575) and executing the MSB "01" program (block 580). This is further illustrated in FIG. 7. As illustrated in FIG. 7, during the MSB "01" program 740 the cell threshold voltage distribution of "11" 701 and transitions to a cell threshold voltage distribution of "01" 705. The MSB data may be stored in the buffer RAM 130 as discussed above with respect to FIG. 1.

Referring now to FIGS. 8 through 11, which illustrate schematic diagrams illustrating operations of page buffers during various programming stages according to some embodiments of the present invention. It will be understood that the page buffers illustrated in FIGS. 8 through 11 are the same page buffer that is illustrated in FIG. 2, but includes additional information with respect to the various programming stages as will be discussed further herein. It will be understood that with respect to all of the page buffers illustrated in FIGS. 8 through 11, when the bit line (BL) is at a logic high state ("1"), programming of the selected memory cell is inhibited, i.e. no current is allowed to flow. When, on the other hand, the bit line (BL) is in a logic low state ("0"), current is allowed to flow to the memory cell and therefore allows data to be programmed into the memory cell associated with the BL. Furthermore, the read signal (RD) is always in a logic low state "0".

Referring first to FIG. 8, a schematic diagram illustrating a page buffer during an LSB program according to some embodiments of the present invention will be discussed. As illustrated in FIG. 8, the path labeled (1) corresponds to a reset of the page buffer 800. The partial circuit 810 illustrated in FIG. 8 illustrates the values around the first through third invertors INV1 through INV3 during a reset operation.

The second path labeled (2) of the page buffer 800 corresponds to the data path. As illustrated by the partial circuits 815 and 820 which illustrate the values around the first through third invertors INV1 through INV3 during a programming operation, inverse read (IRD) is a logic high ("1") when the program data is "0" and a logic low ("0" or "L") when the program data is a "1". Finally, the third path labeled (3) of the page buffer 800 corresponds to the programming path that programs the memory cell in the memory cell array.

Referring now to FIG. 9, a schematic block diagram illustrating operations of a page buffer during an MSB "00" program according to some embodiments of the present invention will be discussed. As illustrated in FIG. 9, the path labeled (3) corresponds to a reset of the page buffer 800. The partial circuit 910 illustrated in FIG. 9 illustrates the values around the first through third invertors INV1 through INV3 during a reset operation.

The first path labeled (1) of the page buffer 900 corresponds to the pre-read of the memory cell before the data is loaded. The partial circuits 920 and 930 in FIG. 9 illustrate the alternative values around the first through third invertors INV1 through INV3 during a pre-read operation.

The second path labeled (2) of the page buffer 900 corresponds to the data path. As illustrated by the partial circuits 940, 950 and 955 which illustrate the values around the first through third invertors INV1 through INV3 during a programming operation, inverse read (IRD) is a logic high ("1")

when the program data is "0" and a logic low ("0" or "L") when the program data is a "1". Finally, the fourth path labeled (4) of the page buffer 900 corresponds to the current path that programs the memory cell in the memory cell array.

Referring now to FIG. 10, a schematic block diagram illustrating operations of a page buffer during an MSB "10" program according to some embodiments of the present invention will be discussed. As illustrated in FIG. 10, the path labeled (4) corresponds to a reset of the page buffer 1000. The partial circuit 1010 illustrated in FIG. 10 illustrates the values around the first through third invertors INV1 through INV3 during a reset operation.

The first path labeled (1) and the second path labeled (2) of the page buffer 1000 corresponds to the first pre-read of the memory cell. The partial circuits 1020 in FIG. 10 illustrate the alternative values around the first through third invertors INV1 through INV3 during the first pre-read operation. The third path labeled (3) and the fourth path labeled (4) of the page buffer 1000 corresponds to the second pre-read of the memory cell. The partial circuits 1030 in FIG. 10 illustrate the alternative values around the first through third invertors INV1 through INV3 during the first pre-read operation.

The MSB "10" program does not include a data read because the data is shadow programmed as discussed above. Finally, the fifth path labeled (5) of the page buffer 1000 corresponds to the current path that programs the memory cell in the memory cell array.

Figure 11:
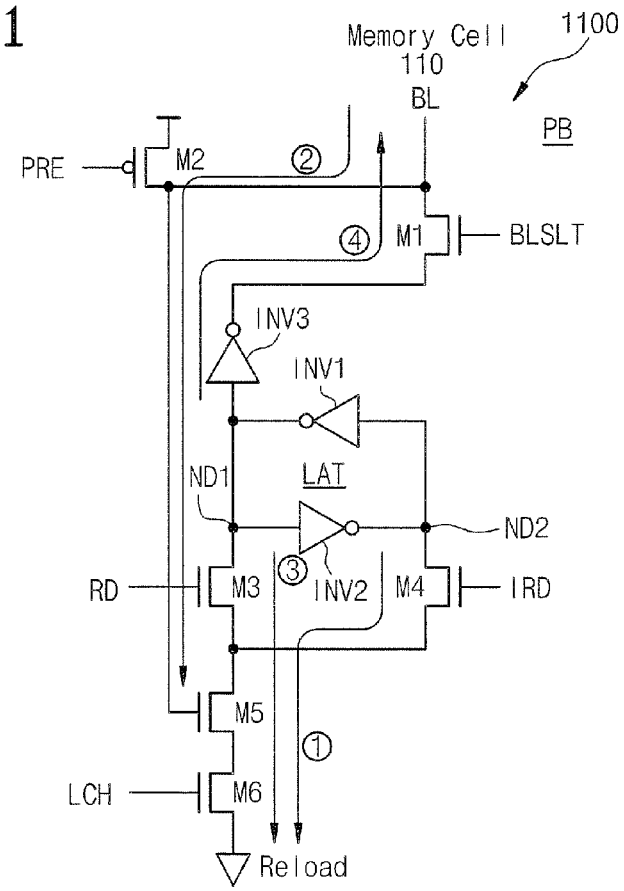
FIG. 11 is a schematic diagram illustrating operations of a page buffer during an MSB "01" program according to some embodiments of the present invention.

Referring now to FIG. 11, a schematic block diagram illustrating operations of a page buffer during an MSB "01" program according to some embodiments of the present invention will be discussed. As illustrated in FIG. 11, the path labeled (3) corresponds to a reset of the page buffer 1100. The partial circuit 1110 illustrated in FIG. 11 illustrates the values around the first through third invertors INV1 through INV3 during a reset operation.

The first path labeled (1) illustrates the data reload from the buffer RAM according to some embodiments of the present invention. The partial circuits 1120 in FIG. 11 illustrate the alternative values around the first through third invertors INV1 through INV3 during the data reload operation. The second path labeled (2) and the third path labeled (3) of the page buffer 1100 correspond to the pre-read of the memory cell. The partial circuits 1130 in FIG. 11 illustrate the alternative values around the first through third invertors INV1 through INV3 during the pre-read operation. Finally, the fourth path labeled (4) of the page buffer 1100 corresponds to the current path that programs the memory cell in the memory cell array.

Figure 13:
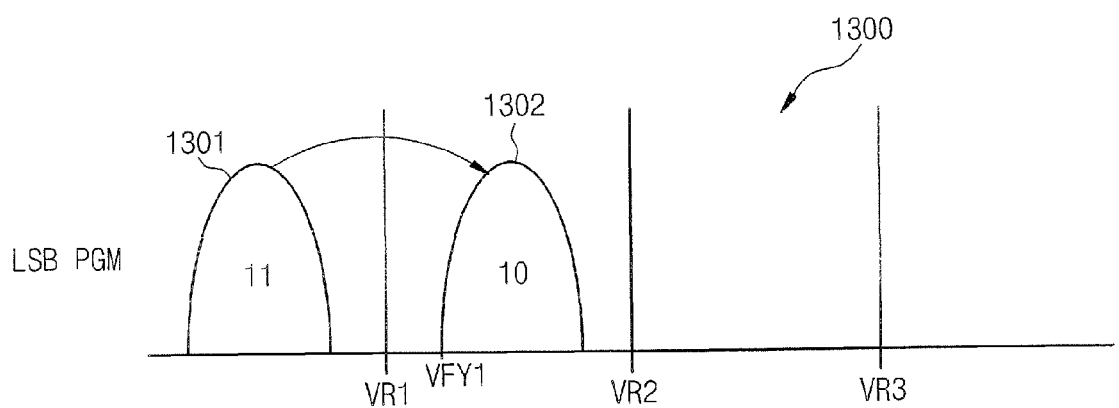
FIG. 13 is a diagram illustrating an LSB program according to some embodiments of the present invention.
Figure 14:
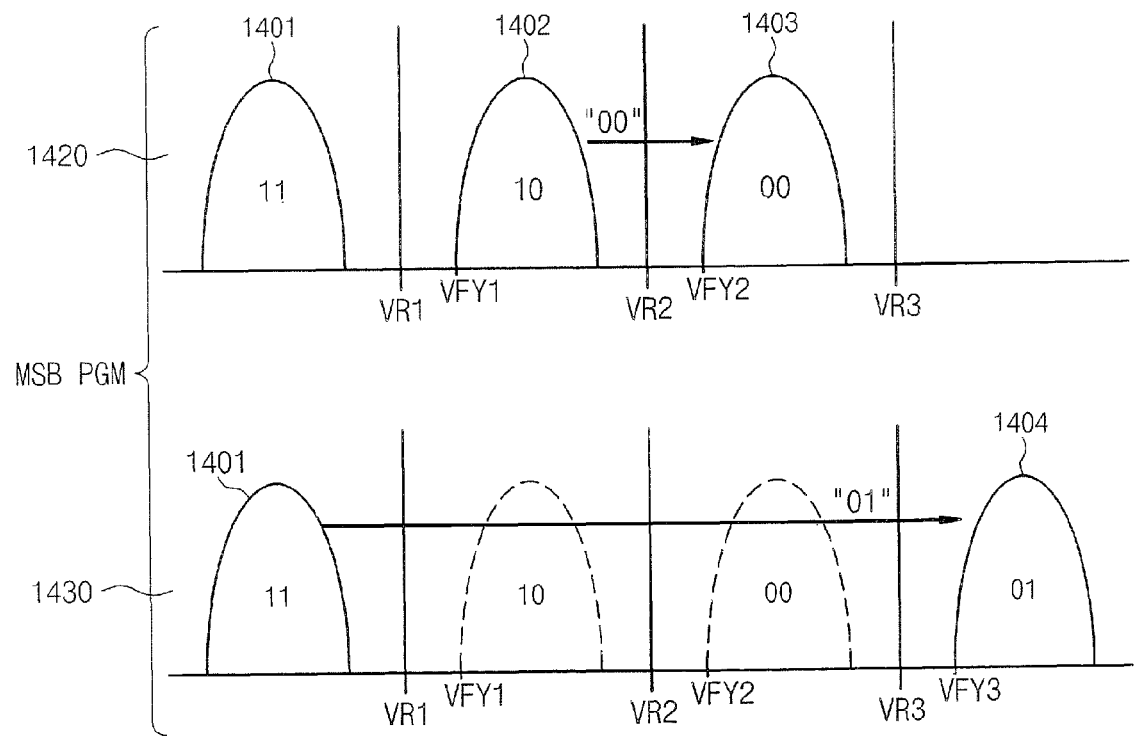
FIG. 14 is a diagram illustrating an MSB program according to some embodiments of the present invention.

Operations according to further embodiments of the present invention will now be discussed with respect to the flowchart of FIG. 12 and the diagrams of FIGS. 13 and 14. FIG. 13 is a diagram illustrating an LSB program according to some embodiments of the present invention and FIG. 14 is a diagram illustrating an MSB program according to some embodiments of the present invention.

Figure 12:
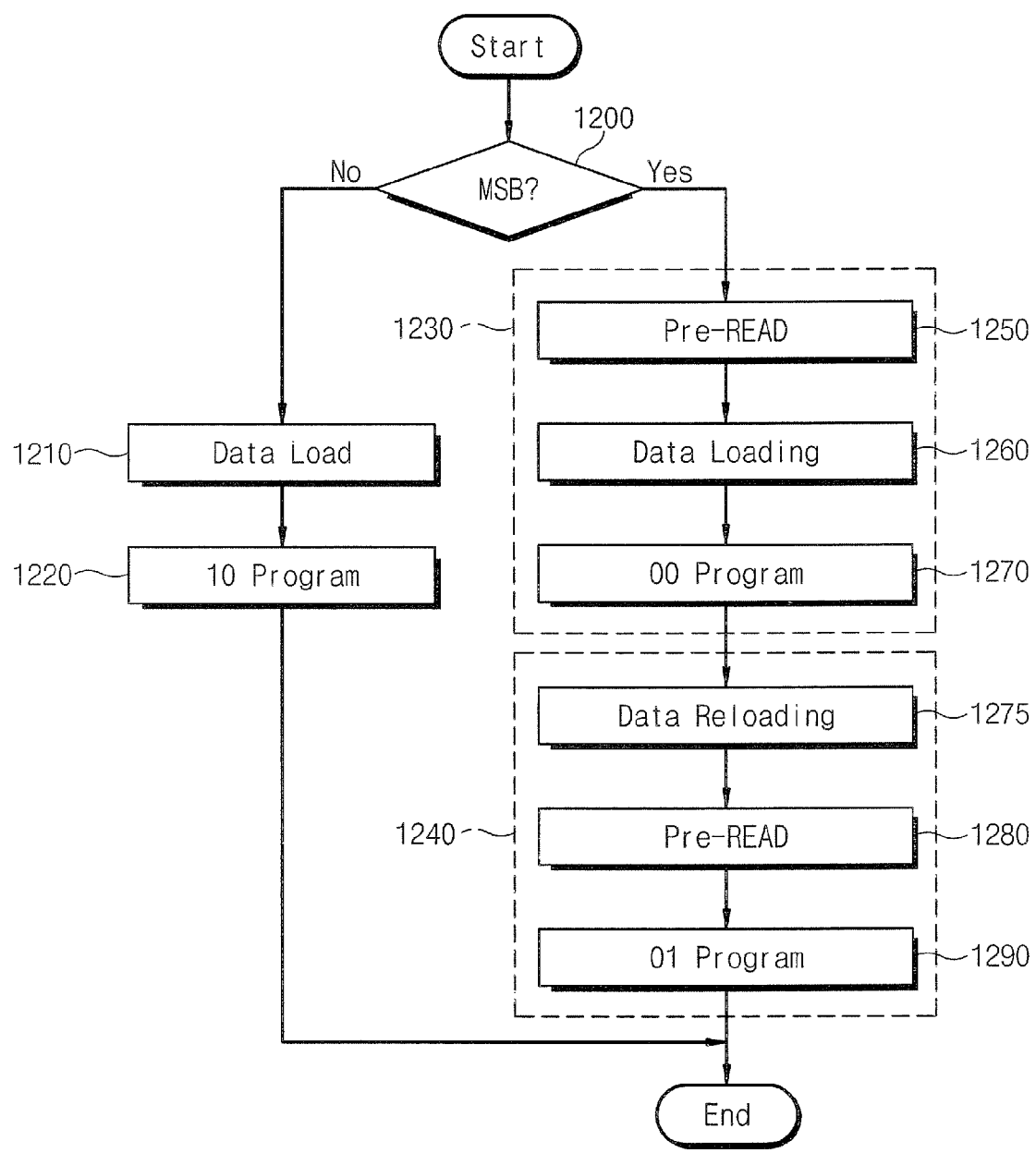
FIG. 12 is a flowchart illustrating operations of programming methods according to some embodiments of the present invention.

Referring first to FIG. 12, operations begin at block 1200 by determining if the MSB is being programmed. If it is determined that the MSB is not being programmed (block 1200), operations of blocks 1210 and 1220 are performed which correspond to the LSB program. In particular, data is loaded (block 1210) and the LSB ("10") program is executed (block 1220). In particular, referring to FIG. 13, as illustrated in the diagram illustrating an LSB program 1300, the LSB program begins with a cell threshold voltage distribution "11" 1301 (the erase state) and ends with a cell threshold distribution of "10" 1302.

If, on the other hand, it is determined that the MSB is being programmed (written into the memory cell array)(block 1200), operations proceed to block 1250. The flowchart of FIG. 12 is divided into two sections. Blocks 1250-1270 represent the operations of the MSB "00" program (block 1230) and blocks 1275-1290 represent the operations of the MSB "01" program (block 1230) according to some embodiments of the present invention.

Executing the MSB "00" program (block 1230) includes pre-reading data from the memory cell (block 1250), loading data into the page buffer (block 1260) and executing the "00" program (block 1270). This is further illustrated in FIG. 14. As illustrated in FIG. 14, during the MSB "00" program 1420 the cell threshold voltage distribution of "10" 1402 transitions to a cell threshold voltage distribution of "00" 1403. Thus, cells 1402 and 1403 correspond to the loaded data "0".

Executing the MSB "01" program (block 1240) comprises reloading data, through the page buffer (block 1275), pre-reading data (block 1280) and executing the MSB "01" program (block 580). This is further illustrated in FIG. 14. As illustrated in FIG. 14, during the MSB "01" program 1430 the cell threshold voltage distribution of "11" 1401 transitions to a cell threshold voltage distribution of "01" 1404. The MSB data may be stored in the buffer RAM 130 as discussed above with respect to FIG. 1.

Figure 15:
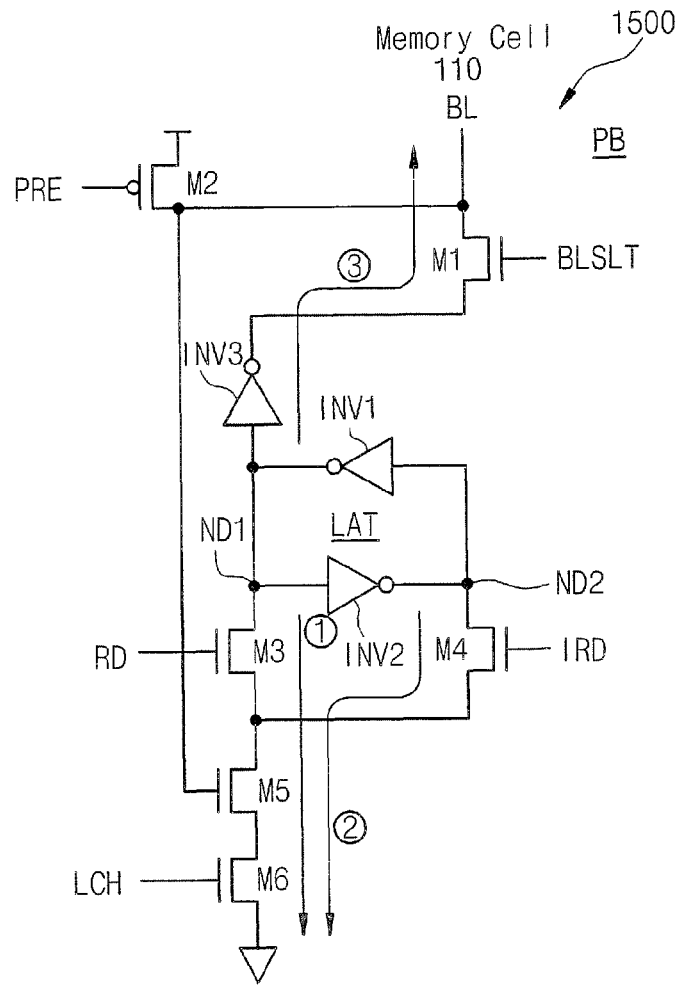
FIG. 15 is a schematic diagram illustrating page buffer operations during an LSB program according to some embodiments of the present invention.
Figure 16:
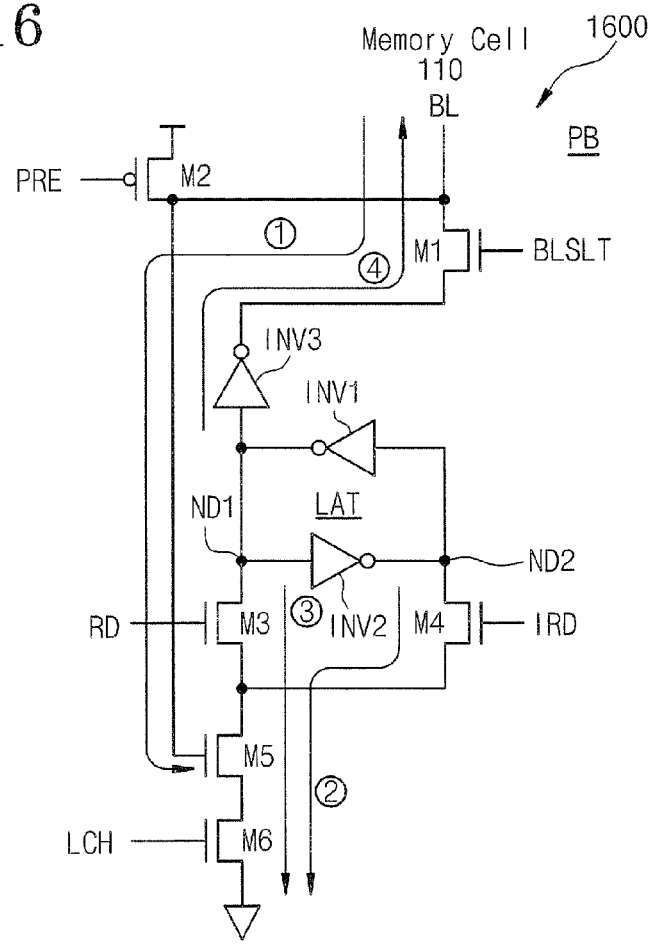
FIG. 16 is a schematic diagram illustrating page buffer operations during an MSB "00" program according to some embodiments of the present invention.
Figure 17:
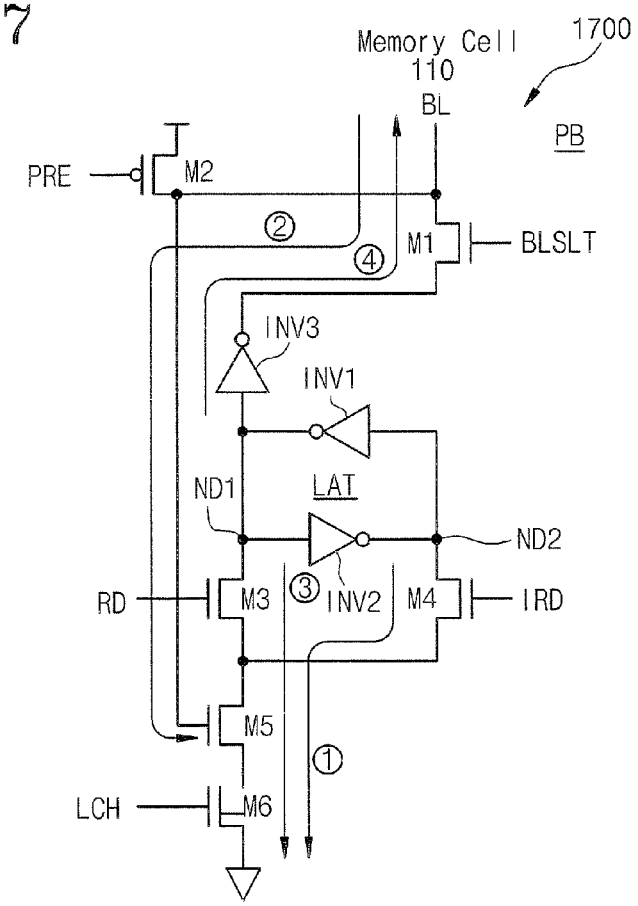
FIG. 17 is a schematic diagram illustrating page buffer operations during an MSB "01" program according to some embodiments of the present invention.

Referring now to FIGS. 15 through 17, which illustrate schematic diagrams illustrating operations of page buffers during various programming stages. It will be understood that the page buffers illustrated in FIGS. 8 through 11 are the same page buffer that is illustrated in FIG. 2, but includes additional information with respect to the various programming stages as will be discussed further herein. It will be understood that with respect to all of the page buffers illustrated in FIGS. 8 through 11, when the bit line (BL) is at a logic high state ("1"), programming of the selected memory cell is inhibited, i.e. no current is allowed to flow. When, on the other hand, the bit line (BL) is in a logic low state ("0"), current is allowed to flow to the memory cell and therefore allows data to be programmed into the memory cell associated with the BL. Furthermore, the read signal (RD) is always in a logic low state "0".

Referring first to FIG. 15, a schematic diagram illustrating a page buffer during an LSB program according to some embodiments of the present invention will be discussed. As illustrated in FIG. 15, the path labeled (1) corresponds to a reset of the page buffer 1500. The partial circuit 1510 illustrated in FIG. 15 illustrates the values around the first through third invertors INV1 through INV3 during a reset operation.

The second path labeled (2) of the page buffer 1500 corresponds to the data path. As illustrated by the partial circuit 1520 which illustrate the values around the first through third invertors INV1 through INV3 during a programming operation, inverse read (IRD) is a logic high ("1") when the program data is "0" and a logic low ("0" or "L") when the program data is a "1". Finally, the third path labeled (3) of the page buffer 1500 corresponds to the programming path that programs the memory cell in the memory cell array.

Referring now to FIG. 16, a schematic block diagram illustrating operations of a page buffer during an MSB "00" program according to some embodiments of the present invention will be discussed. As illustrated in FIG. 16, the path labeled (3) corresponds to a reset of the page buffer 1600. The partial circuit 1610 illustrated in FIG. 16 illustrates the values around the first through third invertors INV1 through INV3 during a reset operation.

The first path labeled (1) and the second path labeled (2) of the page buffer 1600 corresponds to the pre-read of the memory cell before the data is loaded. The partial circuits 1620 in FIG. 16 illustrate the alternative values around the first through third invertors INV1 through INV3 during a pre-read operation.

The third path labeled (3) of the page buffer 1600 corresponds to the data path. As illustrated by the partial circuits 160, which illustrate the values around the first through third invertors INV1 through INV3 during a programming operation, inverse read (IRD) is a logic high ("1") when the program data is "0" and a logic low ("0" or "L") when the program data is a "1". Finally, the fourth path labeled (4) of the page buffer 1600 corresponds to the current path that programs the memory cell in the memory cell array.

Referring now to FIG. 17, a schematic block diagram illustrating operations of a page buffer during an MSB "01" program according to some embodiments of the present invention will be discussed. As illustrated in FIG. 17, the path labeled (3) corresponds to a reset of the page buffer 1700. The partial circuit 1710 illustrated in FIG. 17 illustrates the values around the first through third invertors INV1 through INV3 during a reset operation.

The first path labeled (1) illustrates the data reload from the buffer RAM according to some embodiments of the present invention. The partial circuits 1720 in FIG. 17 illustrate the alternative values around the first through third invertors INV1 through INV3 during the data reload operation. The second path labeled (2) and the fourth path labeled (4) of the page buffer 1700 correspond to the pre-read of the memory cell. The partial circuits 1730 in FIG. 17 illustrate the alternative values around the first through third invertors INV1 through INV3 during the pre-read operation. Finally, the fourth path labeled (4) of the page buffer 1700 corresponds to the current path that programs the memory cell in the memory cell array.

Figure 18:
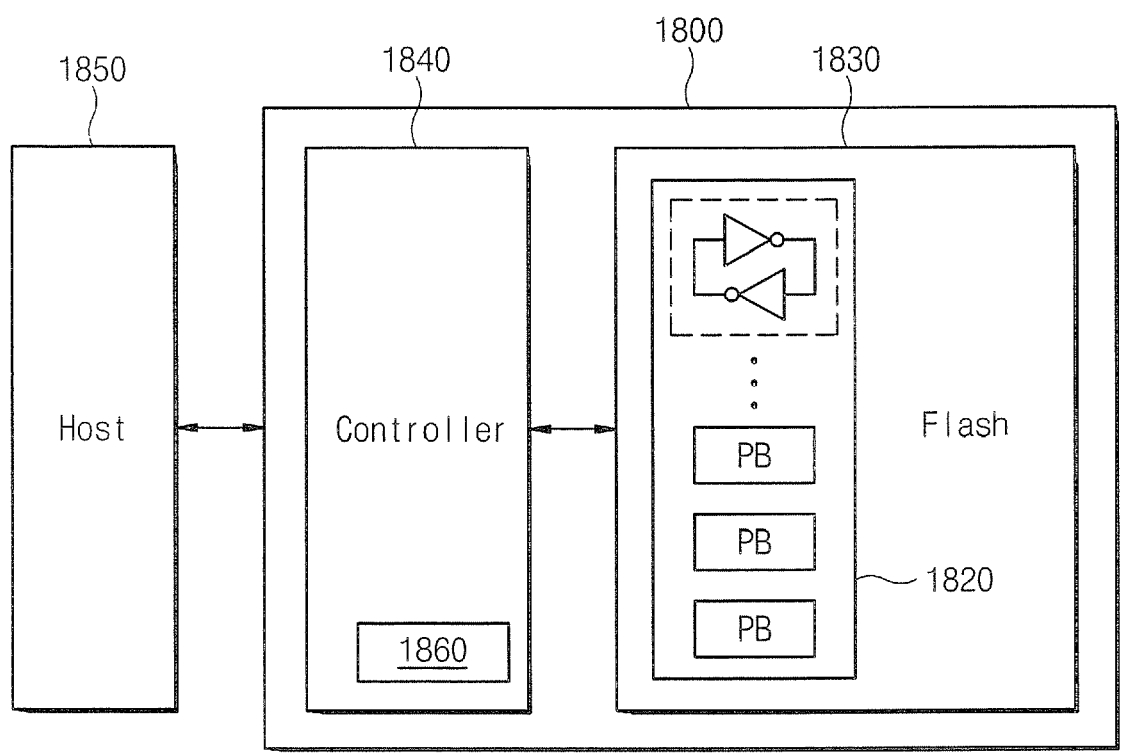
FIG. 18 is a block diagram illustrating a flash memory device according to some embodiments of the present invention.

Referring now to FIG. 18, a block diagram illustrating a flash memory device according to some embodiments of the present invention will be discussed. In particular, FIG. 18 illustrates a flash memory card 1800 coupled to an external host device 1850. The host 1850 interfaces with the memory card 1800. The host 1850 may be, for example, a computer, PDA, camera, PSP, PMP, mobile phone and the like, without departing from the scope of the present invention.

The memory card 1800 includes a controller 1840 and a NAND flash memory 1830. As illustrated in FIG. 18, the controller can include the buffer RAM 1860 according to embodiments of the present invention. The NAND flash memory includes a single latch page buffer 1820 according to some embodiments of the present invention. The details of the page buffer 1820 and the buffer RAM 1860 were discussed above and will not be repeated herein in the interest of brevity.

Referring now to FIG. 19, a multi-bit flash memory system according to some embodiments of the present invention will be discussed. The flash memory of FIG. 19 is similar to the flash memory of FIG. 1, except the page buffer 1920 is a three-bit page buffer. Thus, first through third bits of multi-bit data is stored in the page buffer 1920 and the fourth bit of multi-bit data are stored in the buffer RAM 1930.

Figure 20:
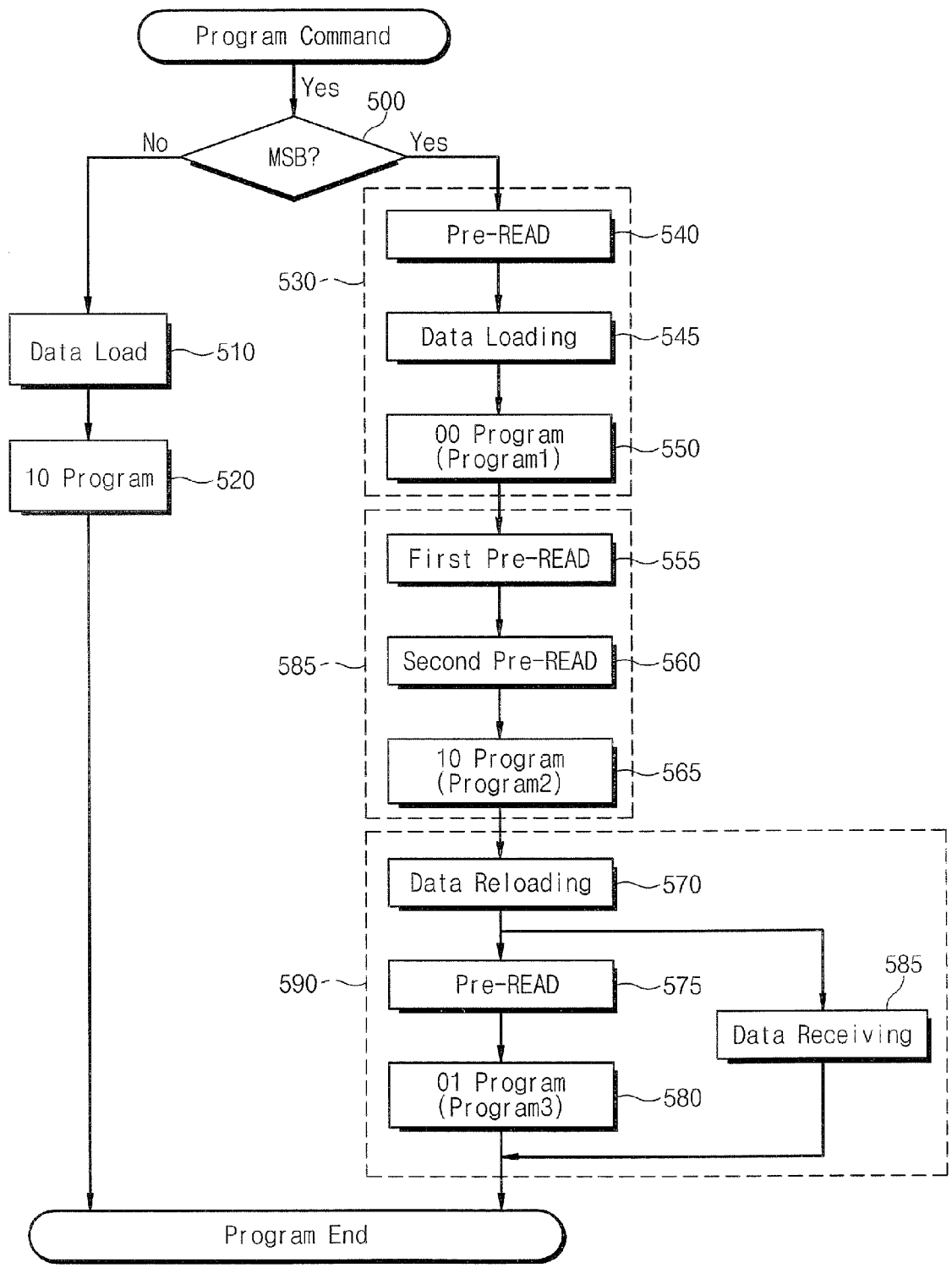
FIG. 20 is a flowchart illustrating operations of programming methods according to some embodiments of the present invention.
Figure 21:
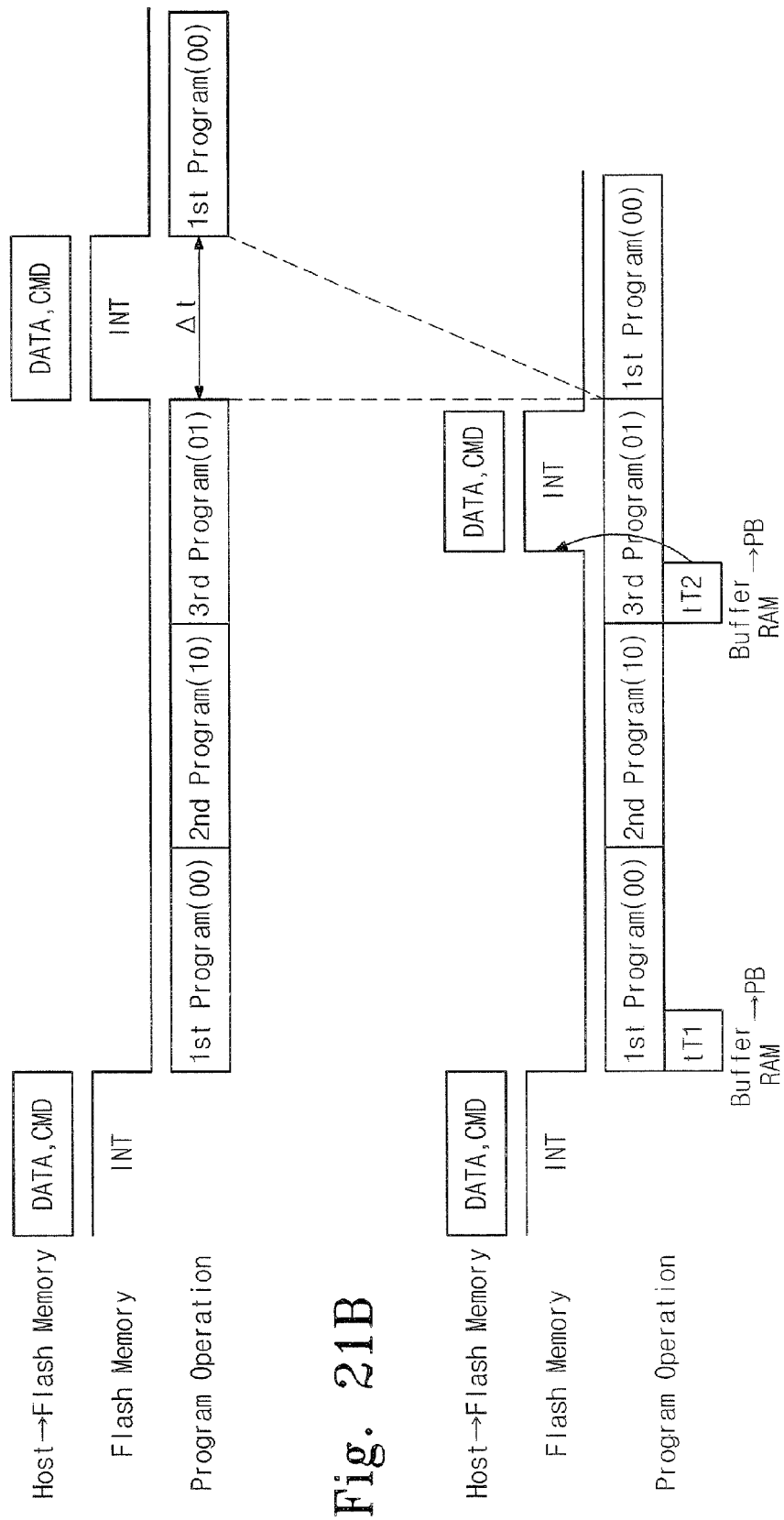
FIGS. 21A and 21B are timing diagrams illustrating operations of programming methods according to some embodiments of the present invention.

FIG. 20 is a flowchart illustrating operations of programming methods according to some embodiments of the present invention, and FIGS. 21A and 21B are timing diagrams illustrating operations of programming methods according to some embodiments of the present invention. Referring first to FIG. 20, operations of programming methods illustrated in FIG. 20 are substantially the same as those discussed above with respect to FIG. 5, except for operations of MSB "01" program (block 590). As illustrated in FIG. 20, after data in a buffer RAM 130 is reloaded into a page buffer 120, data to be next written may be loaded into the buffer RAM 130 under the control of control logic 140 (block 585). That is, while MSB "01" program is being performed, it is possible to load data to be next written into the buffer RAM 130.

In particular, if the MSB "01" program does not include transferring data into the buffer RAM 130, after a final program process, that is, the MSB "01" program is completed, a program operation may be interrupted to receive data to be next written. In these embodiments, control logic 140 may generate an interrupt signal INT of a ready state, which is transferred to an external host device 150. The external host device 150 may provide data and write command DATA and CMD to a multi-bit flash memory device 105 in response to the interrupt signal INT of a ready state. The multi-bit flash memory device 105 may perform a program operation based upon the received data and write command. Thus, as illustrated in FIG. 21A, a program operation may be interrupted during a time interval Δt.

In some embodiments of the present invention, the MSB "01" program includes transferring data into the buffer RAM 130 (block 585). In these embodiments, after MSB data stored in the buffer RAM 130 is reloaded into the page buffer 120 during a time interval tT2 (FIG. 21B), the control logic 140 may output the interrupt signal INT of a ready state informing the host device 150 that the buffer RAM 130 is capable of being accessed, that is, that the multi-bit flash memory device 105 is ready to receive data. In other words, the control logic 140 may generate the interrupt signal INT of a ready state before the MSB "01" program is ended, not after the MSB "01" program is ended.

The external host device 150 may provide data to be next written and a write command to the multi-bit flash memory device 105 in response to the interrupt signal INT of a ready state. During a ready interval of the interrupt signal INT, the multi-bit flash memory device 105 may receive the data to be next written and a write command at the same time when the MSB "01" program is being performed. Accordingly, it may be possible to improve a program speed/performance of the multi-bit flash memory device 105.

Figure 22:
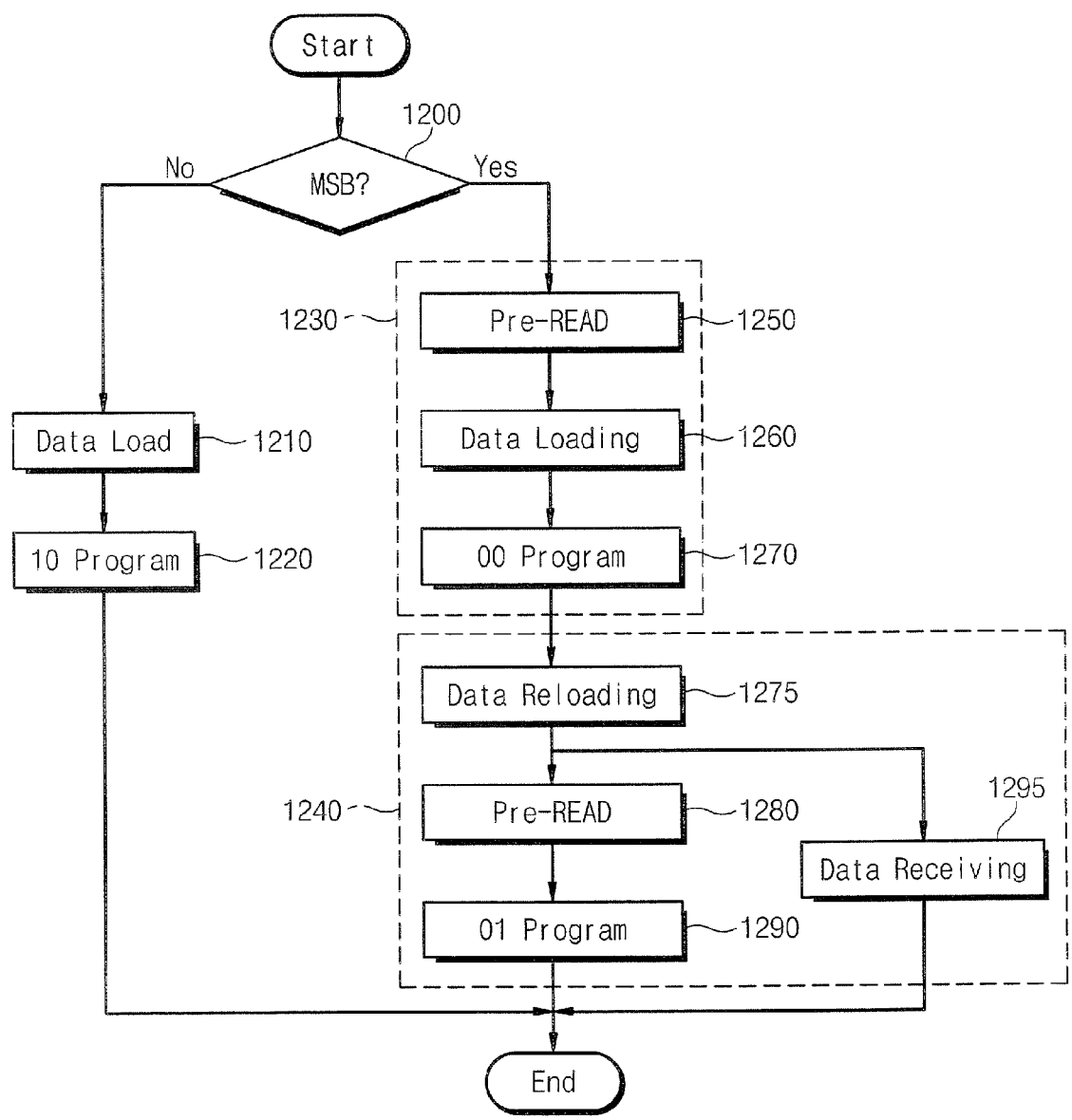
FIG. 22 is a flowchart illustrating operations of programming methods according to some embodiments of the present invention.
Figure 23:
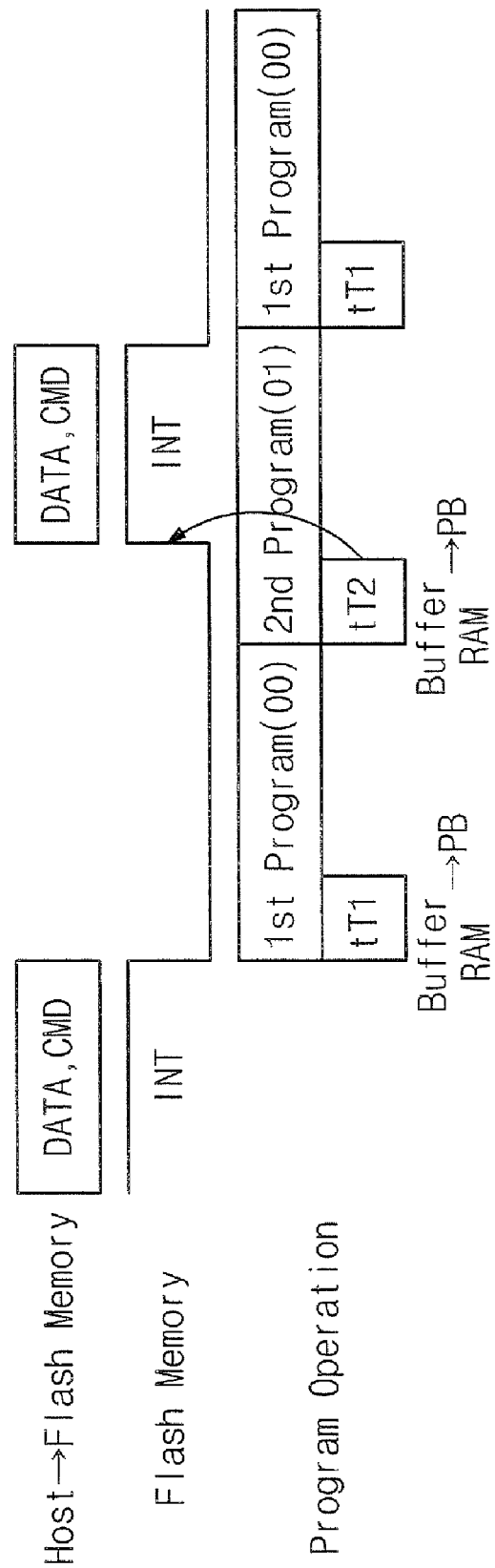
FIG. 23 is a timing diagram illustrating operations of programming methods according to some embodiments of the present invention.

FIG. 22 is a flowchart illustrating operations of programming methods according to some embodiments of the present invention, and FIG. 23 is a timing diagram illustrating operations of programming methods according to some embodiments of the present invention. Referring first to FIG. 22, operations of programming methods illustrated in FIG. 22 are substantially the same as those discussed above with respect to FIG. 12 except for operations of MSB "01" program (block 1240). As illustrated in FIG. 22, after data in a buffer RAM 130 is reloaded into a page buffer 120, data to be next written may be loaded into the buffer RAM 130 under the control of control logic 140 (block 1295). That is, while MSB "01" program is being performed, it may be possible to load data to be next written into the buffer RAM 130.

In particular, MSB "01" program according to the some embodiments of the present invention includes transferring data into the buffer RAM 130 (block 1295). In these embodiments, after MSB data stored in the buffer RAM 130 is reloaded into the page buffer 120 during a time interval tT2 (FIG. 23), the control logic 140 may output the interrupt signal INT of a ready state informing the host device 150 that the buffer RAM 130 is capable of being accessed, that is, that the multi-bit flash memory device 105 is ready to receive data. In other words, the control logic 140 may generate the interrupt signal INT of a ready state before the MSB "01" program is ended, not after the MSB "01" program is ended.

The external host device 150 may provide data to be next written and a write command to the multi-bit flash memory device 105 in response to the interrupt signal INT of a ready state. During a ready interval of the interrupt signal INT, the multi-bit flash memory device 105 may receive the data to be next written and a write command at the same time when the MSB "01" program is being performed. Accordingly, it may be possible to improve a program speed/performance of the multi-bit flash memory device 105.

Figure 24:
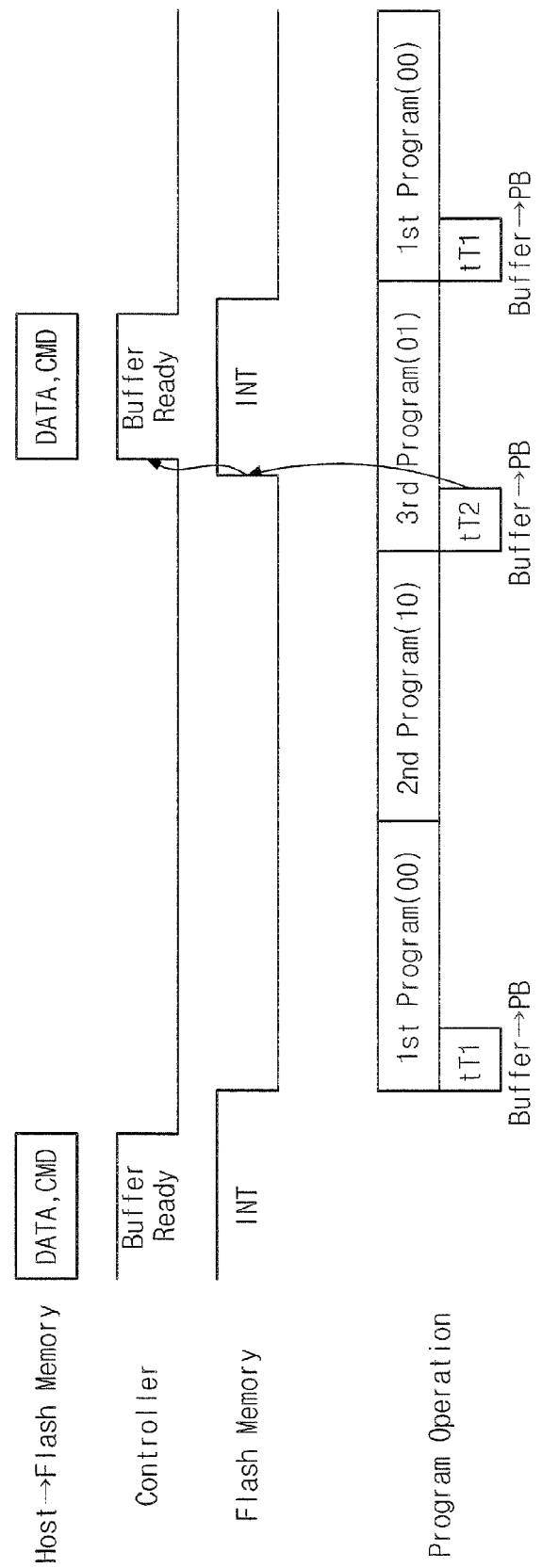

FIG. 24 is a timing diagram of a memory card illustrating operations of programming methods according to some embodiments of the present invention. Operations of a multi-bit flash memory device 105 and a flash memory card 1800 according to timing diagrams illustrated in FIG. 24 are substantially similar to those discussed above with respect to FIGS. 21 and 23, except including the following differences.

First of all, MSB "00" program, MSB "10" program, and MSB "01" program may be carried out in the same manner as discussed above. In case of the MSB "01" program being a final program process, MSB data stored in a buffer RAM 1860 is reloaded into a NAND flash memory device 1820 under the control of a controller 1840 during a time interval tT2 in FIG. 24. After reloading of MSB data into the NAND flash memory device 1820 is completed, the NAND flash memory device 1820 generates an interrupt signal INT, which is transferred into the controller 1840. As the interrupt signal INT is received, the controller 1840 generates a buffer ready signal in response to the interrupt signal INT. The buffer ready signal is a buffer accessible signal informing a host 1850 that the buffer 1860 is accessible. The host 1850 responds to the buffer ready signal to provide data to be next written and a write command to the controller 1840. During an active interval of the buffer ready signal, the controller 1840 receives data to be next written DATA and a write command CMD. The received data to be next written is stored in the buffer RAM 1860. After the MSB "01" program is completed, the data stored in the buffer RAM 1860 is written in the NAND flash memory device 1830 under the control of the controller 1840, which is accomplished in the same manner as described above.

FIG. 25 is a timing diagram of a memory card illustrating operations of programming methods according to some embodiments of the present invention. Operations of a multi-bit flash memory device 105 and a flash memory card 1800 according to timing diagrams illustrated in FIG. 25 are substantially the same as those discussed above with respect to FIG. 24 except that MSB "00" program and MSB "01" program are carried out. Details are omitted in the interest of brevity.

As briefly discussed above, a multi-bit program operation is not interrupted during a given time interval Δt to receive data to be next programmed and a write command. In other words, it may be possible to receive data to be next written and a write command without interrupting a program operation that is being currently performed. Thus, it may be possible to improve a program speed of a memory card, that is, program performance of a memory card.

The foregoing is illustrative of the present invention and is not to be construed as limiting thereof. Although a few exemplary embodiments of this invention have been described, those skilled in the art will readily appreciate that many modifications are possible in the exemplary embodiments without materially departing from the novel teachings and advantages of this invention. Accordingly, all such modifications are intended to be included within the scope of this invention as defined in the claims. Therefore, it is to be understood that the foregoing is illustrative of the present invention and is not to be construed as limited to the specific embodiments disclosed, and that modifications to the disclosed embodiments, as well as other embodiments, are intended to be included within the scope of the appended claims.

That which is claimed is:

1. A multi-bit flash memory device comprising:
an array of memory cells;
a page buffer block including page buffers, each of the page buffers having a single latch structure and performing a write operation with respect to memory cells according to loaded data;
a buffer random access memory (RAM) configured to store program data provided from an external host device during a multi-bit program operation; and
control logic configured to control the page buffer block and the buffer RAM so that program data stored in the buffer RAM is reloaded into the page buffer block whenever data programmed before the multi-bit program operation is compared with data to be currently programmed,
wherein the control logic is configured to store data to be programmed next in the buffer RAM before the multi-bit program operation is completed.

2. The multi-bit flash memory device of claim 1, wherein the multi-bit program operation includes an LSB program operation and an MSB program operation, and the MSB program operation includes a plurality of program operations.

3. The multi-bit flash memory device of claim 2, wherein the control logic is further configured to output a buffer accessible signal to the external host device after program data in the buffer RAM is reloaded into the page buffer block within the last one of the plurality of program operations.

4. The multi-bit flash memory device of claim 3, wherein the buffer RAM is configured to store data to be next programmed under the control of the control logic when the buffer accessible signal is transferred to the external host device.

5. The multi-bit flash memory device of claim 3, wherein the control logic is further configured to receive a write command from the external host device when the buffer accessible signal is output to the external host device, and perform a next multi-bit program operation in response to the received write command.

6. The multi-bit flash memory device of claim 3, wherein each of the memory cells is programmed to have one of "01", "10" and "00" states, the plurality of program operations is formed of first to third program operations, and the third program operation is the last program operation.

7. The multi-bit flash memory device of claim 6, wherein the memory cells are programmed to have one of the "01", "10", and "00" states via the first to third program operations.

8. The multi-bit flash memory device of claim 3, wherein each of the memory cells is programmed to have one of "00", "10" and "01" states, the plurality of program operations is formed of first and second program operations, and the second program operation is the last program operation.

9. The multi-bit flash memory device of claim 8, wherein the memory cells are programmed to have one of the "00" and "01" states via the first and second program operations.

10. A memory card comprising:
a NAND flash memory including an array of memory cells and a page buffer block including page buffers, each of the page buffers having a single latch structure; and
a controller including a buffer RAM that is configured to store program data provided from an external host device during a multi-bit program operation,
wherein the controller is configured to control the NAND flash memory so that program data stored in the buffer RAM is reloaded into the page buffer block whenever data programmed before the multi-bit program operation is compared with data to be currently programmed; and wherein the controller receives data to be next programmed from the external host device under the control of the NAND flash memory device before the multi-bit program operation is completed.

11. The memory card of claim 10, wherein the data to be next programmed is stored in the buffer RAM.

12. The memory card of claim 10, wherein the multi-bit program operation includes an LSB program operation and an MSB program operation, and the MSB program operation includes a plurality of program operations.

13. The memory card of claim 12, wherein the controller is further configured to output a buffer accessible signal to the external host device under the control of the NAND flash memory after program data in the buffer RAM is reloaded into the page buffer block within the last one of the plurality of program operations,.

14. The memory card of claim 13, wherein the buffer RAM is configured to store data to be next programmed under the control of the controller when the buffer accessible signal is transferred to the external host device.

15. The memory card of claim 13, wherein the controller is configured to receive a write command from the external host device when the buffer accessible signal is output to the external host device, and perform a next multi-bit program operation in response to the received write command.

16. The memory card of claim 13, wherein each of the memory cells is programmed to have one of "01", "10" and "00" states, the plurality of program operations is formed of first to third program operations, and the third program operation is the last program operation.

17. The memory card of claim 13, wherein each of the memory cells is programmed to have one of "00", "10" and "01" states, the plurality of program operations is formed of first and second program operations, and the second program operation is the last program operation.

18. A multi-bit program method of a multi-bit flash memory device having an array of memory cells, the method comprising:

loading data stored in a buffer RAM into a page buffer block to perform a program operation with respect to memory cells according to the loaded data into the page buffer block, during a multi-bit program operation, wherein program data stored in the buffer RAM is reloaded into the page buffer block whenever programmed data is compared with data to be currently programmed; and wherein before the multi-bit program operation is completed, data to be next programmed from an external host device is stored in the buffer RAM.

19. The multi-bit program method of claim 18, wherein the multi-bit program operation includes an LSB program operation and an MSB program operation, and the MSB program operation includes a plurality of program operations.

20. The multi-bit program method of claim 19, wherein reloading program data in the buffer RAM into the page buffer block within the last one of the plurality of program operations is followed by storing data to be next programmed in the buffer RAM.

21. The multi-bit program method of claim 20, wherein each of the memory cells is programmed to have one of "01", "10" and "00" states, the plurality of program operations is formed of first to third program operations, and the third program operation is the last program operation.

22. The multi-bit program method of claim 21, wherein the memory cells are programmed to have one of the "01", "10", and "00" states via the first to third program operations.

23. The multi-bit program method of claim 20, wherein each of the memory cells is programmed to have one of "00", "10" and "01" states, the plurality of program operations is formed of first and second program operations, and the second program operation is the last program operation.

24. The multi-bit program method of claim 23, wherein the memory cells are programmed to have one of the "00" and "01" states via the first and second program operations.

* * * * *